United States Patent
Zamprogno et al.

(10) Patent No.: US 12,413,045 B2
(45) Date of Patent: Sep. 9, 2025

(54) LASER DRIVER INCORPORATING CLAMPING CIRCUIT WITH FREEWHEELING DIODE

(71) Applicants: STMicroelectronics S.r.l., Agrate Brianza (IT); POLITECNICO DI MILANO, Milan (IT)

(72) Inventors: Marco Zamprogno, Cesano Maderno (IT); Alireza Tajfar, Milan (IT)

(73) Assignees: STMicroelectronics S.r.l., Agrate Brianza (IT); POLITECNICO DI MILANO, Milan (IT)

( * ) Notice: Subject to any disclaimer, the term of this patent is extended or adjusted under 35 U.S.C. 154(b) by 647 days.

(21) Appl. No.: 17/852,100

(22) Filed: Jun. 28, 2022

(65) Prior Publication Data

US 2022/0329042 A1  Oct. 13, 2022

Related U.S. Application Data

(63) Continuation of application No. 17/026,495, filed on Sep. 21, 2020, now Pat. No. 11,418,007, which is a
(Continued)

(51) Int. Cl.
*H01S 3/00* (2006.01)
*H01S 5/042* (2006.01)
(Continued)

(52) U.S. Cl.
CPC ............ *H01S 5/0428* (2013.01); *H01S 5/042* (2013.01); *H01S 5/0427* (2013.01);
(Continued)

(58) Field of Classification Search
CPC ...... H01S 5/0428; H01S 5/042; H01S 5/0427; H01S 5/06216; H01S 5/06825; H01S 5/06226
See application file for complete search history.

(56) References Cited

U.S. PATENT DOCUMENTS 5,163,063 A  11/1992 Yoshikawa et al.
5,848,044 A  12/1998 Taguchi et al.
(Continued)

FOREIGN PATENT DOCUMENTS

CN  102111070 A  6/2011
CN  104427723 A  3/2015
(Continued)

OTHER PUBLICATIONS

CN First Office Action and Search Report for counterpart CN Appl. No. 202010591912.6, report dated Dec. 17, 2024, 7 pgs.
(Continued)

*Primary Examiner* — Kinam Park
(74) *Attorney, Agent, or Firm* — Crowe & Dunlevy LLC

(57) ABSTRACT

An input is coupled to a cathode of a laser diode having its anode coupled to a high-voltage-supply, with a cascoded current mirror having an input and output branches. The input branch is coupled between the high-voltage-supply and a sense resistor coupled to the input. The output branch is coupled between the high-voltage-supply and an output. A sense resistance is coupled between the output and ground, and includes a diode-coupled transistor coupled to the output and a resistor coupled between the diode-coupled transistor and ground. The input branch generates a current proportional to a voltage across the laser diode, and the output branch generates a mirrored current proportional to the current proportional to the voltage across the laser diode. A voltage proportional to the voltage across the laser diode is generated by the mirrored current flowing through the sense resistance. A comparison circuit compares this voltage to a threshold.

18 Claims, 9 Drawing Sheets

Related U.S. Application Data continuation of application No. 16/454,717, filed on Jun. 27, 2019, now Pat. No. 10,826,268.

(51) Int. Cl.
*H01S 5/062* (2006.01)
*H01S 5/068* (2006.01)

(52) U.S. Cl.
CPC ...... *H01S 5/06216* (2013.01); *H01S 5/06825* (2013.01); *H01S 5/06226* (2013.01)

(56) References Cited

U.S. PATENT DOCUMENTS

| | | |
|---|---|---|
| 6,259,714 B1 | 7/2001 | Kinbara |
| 6,417,738 B1 | 7/2002 | Lautzenhiser |
| 6,771,133 B2 | 8/2004 | Lautzenhiser |
| 6,819,612 B1 | 11/2004 | Achter |
| 7,298,173 B1 | 11/2007 | Jiang et al. |
| 2003/0001637 A1 | 1/2003 | Jung |
| 2003/0012321 A1 | 1/2003 | Tokutome et al. |
| 2003/0200518 A1 | 10/2003 | Saeki |
| 2003/0201812 A1 | 10/2003 | Suzuki |
| 2005/0243879 A1 | 11/2005 | Horiuchi et al. |
| 2007/0188206 A1 | 8/2007 | Lee |
| 2011/0043269 A1 | 2/2011 | Nishijima et al. |
| 2011/0064098 A1 | 3/2011 | Omori et al. |
| 2012/0008342 A1 | 1/2012 | Hsu et al. |
| 2012/0049829 A1 | 3/2012 | Murakami |
| 2012/0154001 A1 | 6/2012 | Seo |
| 2014/0063593 A1 | 3/2014 | Berendt |
| 2014/0203854 A1 | 7/2014 | Jung et al. |
| 2015/0097604 A1 | 4/2015 | Taniguchi |
| 2016/0173109 A1 | 6/2016 | Montoriol et al. |
| 2017/0063027 A1 | 3/2017 | Saha |
| 2018/0278017 A1 | 9/2018 | Mignoli et al. |
| 2018/0323576 A1 | 11/2018 | Crawford et al. |
| 2020/0395734 A1 | 12/2020 | Asuncion et al. |

FOREIGN PATENT DOCUMENTS

| | | |
|---|---|---|
| CN | 104682190 A | 6/2015 |
| CN | 105514796 A | 4/2016 |
| CN | 212875045 U | 4/2021 |

OTHER PUBLICATIONS

Chen, Jie-Ting, et al: On-Chip ESD Protection Device for High-Speed I/O Applications in CMOS Technology, IEEE Transactions on Electron Devices, vol. 64, No. 10, Oct. 2017, 7 pgs.

EPO Search Report and Written Opinion for co-pending EP Appl. No. 20179464.1 dated Nov. 9, 2020 (15 pages).

Tajfar Alireza et al: "A 20 A Sub-Nanosecond Integrated CMOS Laser Diode Driver for High Repetition Rate SPAD-Based Direct Time-of-Flight Measurements". 2018 International Conference On Computing, Electronics & Communications Engineering (ICCECE), IEEE, Aug. 16, 2018, pp. 272-276, XP033526195.

EP Search Report for co-pending EP Appl. No. 20179464 dated Mar. 1, 2021 (16 pages).

LASER DRIVER INCORPORATING CLAMPING CIRCUIT WITH FREEWHEELING DIODE

RELATED APPLICATION

This application is a continuation of U.S. application patent Ser. No. 17/026,495, filed on Sep. 21, 2020, which is a continuation of U.S. application patent Ser. No. 16/454, 717, filed on Jun. 27, 2019, the contents of all of which are incorporated by reference in their entirety to the maximum extent allowable under the law.

TECHNICAL FIELD

This application is directed to the field of laser driving, and in particular, is directed to a circuit for generating pulses (based upon which a laser diode is driven) having a desired pulse width, by underdamping a laser driver and using clamping to dampen oscillations occurring upon turn-off of the laser driver.

BACKGROUND

Time-of-flight ranging applications, such as Light Detection and Ranging (LIDAR), utilize a laser diode (typically infrared) that is driven with a pulsed drive current to cause it to emit a short laser pulse in a given direction. The laser pulse is reflected by a (possible) object in that given direction, and a receiver receives and reads the reflected laser pulse. The receiver, with a proper timing reference, measures the elapsed time between emitting the laser pulse and receiving the reflected laser pulse. From this elapsed time, the distance to the object can be evaluated.

In addition to typical challenges involved with this technology that are known and understood by those of skill in the art (e.g., dark pulses, averaging of received reflected pulses, and the use of post-processing to obtain a desired level of accuracy), it is desired to reduce the pulse width of the laser pulse. For example, taking into account the elapsed time for the laser pulse to reach the object, be reflected off the object, and return to the receiver, since the speed of light is known and constant, the distance to the object can be determined; therefore, as a numerical example, each time t of 1 ns can be associated with a distance of $d=2*c*t=60$ cm, where c is the speed of light. An optical pulse on the order of 1 ns is therefore not useful if it is desired to discriminate distances below 60 cm with accuracy.

Since the pulse width of the optical pulse is related to the pulse width of the pulsed drive current, it is therefore desired to be able to produce a pulsed drive current having a shorter pulse width so that the pulse width of the laser pulses can be reduced to thereby increase accuracy and enable discrimination of even shorter distances. In order to obtain accurate ranging information, it is desired to increase the repetition rate of the laser pulses, and therefore the repetition rate of the pulsed drive current. In addition, since a conventional laser diode does not immediately turn-on and lase (emit laser light) when driven by the pulsed drive current, there is a turn-on time. Since the turn-on time reduces the repetition rate of the laser pulses, it is also desired to decrease the turn-on time.

The challenges encountered by the prior art in attempting to address the above issues are now described. Shown in the graph of FIG. 1A is a drive current for a laser diode over time. To cause a laser diode to emit a laser pulse, it is desired to drive it with a sharp narrow drive pulse for spatial accuracy when making a ranging measurement. However, designing a laser driver involves certain tradeoffs. The narrower the drive pulse, the sharper its rise and fall. Too sharp of a fall can cause "ringing", by which the drive current of the drive pulse oscillates (shown by the dashed line labeled as "Oscillation"), potentially with enough magnitude to cause emission of a second unplanned laser pulse, which is undesirable for any ranging application (whether time of flight or LIDAR). While a drive pulse can be shaped so as to have a sharp rise and slow fall (shown by the dashed line labeled as "Slow"), a slow fall can impact efficiency, and is therefore undesirable. Therefore, it is now known to dampen (but not widen) the fall of the drive pulse, producing the pulse shown with a solid line.

Now described with reference to FIG. 1B is a known laser driver circuit 10 for a laser diode LD. The laser driver circuit 10 includes a driver amplifier 11 that receives a trigger pulse, and, responsive to an edge of the trigger pulse (for example, the rising edge), drives a switch SW. The pulse width of the laser produced by the laser driver circuit 10 is not sensitive to the pulse width of the trigger pulse, but is simply edge sensitive.

The switch SW is an n-channel MOS transistor having its source coupled to ground and its gate biased by the driver amplifier 11. While the switch SW is illustrated as an NMOS transistor, it could instead be an avalanche transistor (e.g., a bipolar transistor operating in avalanche breakdown).

An illustrated inductance Lp,sw is shown as coupled between the drain of the switch SW and node N, and represents the sum of series parasitic inductances between the drain of the switch SW and node N (e.g., the parasitic inductance of the PCB traces between the drain of the switch SW and node N, and the parasitic inductance of resistor Rclamp). An illustrated inductance Lp,up is shown as coupled between node N and a pull up resistor Rpullup, and represents the sum of series parasitic inductances between node N and VHV (e.g., the parasitic inductance of the PCB traces between node N and VHV, and the parasitic inductance of the resistor Rpullup). The pull up resistor Rpullup is coupled between node N and the high voltage supply node VHV. The clamping resistor Rclamp is coupled between the drain of the switch SW and node N.

A laser diode LD has its anode coupled to ground and its cathode coupled the output node OUT through an illustrated parasitic inductance Lp,Ld. The illustrated parasitic inductance Lp,Ld is coupled between the cathode of the laser diode LD and the output node OUT, and represents a sum of the parasitic inductances in series to the laser diode LD between ground and the output node OUT (e.g., the parasitic inductance of the PCB traces between ground and the output node OUT, and the parasitic inductance of the laser diode LD itself). A diode D has its anode coupled to the output node OUT and its cathode coupled to ground. A capacitor C is coupled between the output node OUT and node N through an illustrated parasitic inductance Lp,c. The parasitic inductance Lp,c represents a sum of the parasitic inductances in series between the output node OUT and node N (e.g., the parasitic inductance of the PCB traces between node OUT and node N, and the parasitic inductance of the capacitor C).

Keep in mind that the illustrated inductances Lp,sw, Lp,up, Lp,Ld and Lp,c represent, as stated, parasitic inductances and not discrete inductances.

Operation of the laser driver circuit 10 is now described. When the trigger pulse for the switch SW is low, the switch SW is off, and therefore no direct current path is present from the high voltage supply node VHV to ground through the laser diode LD. Node N is therefore biased to VHV, while the output node OUT is substantially at ground. When a rising edge of the trigger pulse is applied to the gate of the switch SW, node N is quickly pulled down to ground, assuming for simplicity that the conductivity of the switch SW is sufficient to overcome the resistance of Rpullup. When node N is pulled down to ground, since the charge stored in the capacitor C is unable to immediately change, the voltage at node OUT will become −VHV—the capacitor C will (at the beginning of the transient) maintain the voltage VHV previously stored therein, and so the pull down to ground of the node N leads to the pull down of the output node OUT at −VHV.

Accordingly, a positive voltage across the laser diode LD results (meaning that the voltage at the anode of the laser diode LD exceeds the voltage at the cathode of the laser diode LD), and the laser diode LD turns on and a current will flow from ground through laser diode LD to the capacitor C. The capacitor C will be discharged by the current from ground. The output node OUT therefore will increase from −VHV to ground, automatically switching off the laser diode LD when its forward voltage (voltage from anode to cathode) falls sufficiently. Viewed at first order, this switching off of the laser diode LD occurs regardless of whether the trigger pulse has transitioned back low or not.

The RLC components of the laser driver circuit 10 so described therefore (if sized accordingly to accurate criteria) work like a properly damped system. Looking at the drive current (the current flowing through the laser diode LD) as shown in FIG. 1A, this leads to a high initial high spike, followed by an exponential decay.

After the above-described lasing event (laser pulse emission) by the laser diode LD, when the switch SW has switched off due to the trigger pulse falling low, the capacitor C will be re-charged from the high voltage supply node VHV through the resistor Rpullup and diode D. The repetition rate of the laser driver circuit 10 is therefore limited by the recovery time of the capacitor C (e.g., the time needed to be charged back to the voltage VHV).

Assuming that the total inductance Ltot of the laser driver circuit 10 is 1 nH, that the peak current Ipeak of the laser drive pulse through the laser diode is 20 A, that the pulse width at half maximum PWHM is 1 ns, and that the rise time of the current through the laser diode LD is 0.5 ns, the following values can be calculated:

$$PWHM = 2 * \sqrt{Ltot * C} \rightarrow C = 250 \text{ pF}$$

$$Ipeak = \frac{VHV}{2} * \sqrt{\frac{C}{Ltot}} \rightarrow VHV = 80 \text{ V}$$

$$Rclamp = Rtot = \sqrt{\frac{Ltot}{C}} = 2\Omega$$

Due to proper component sizing, for example of Rclamp (which is sized so as to alter the resistance, and thus the time constant, of the RLC circuit formed between the laser diode LD and the switch SW), the laser driver circuit 10 is damped. This means that, as previously described, the laser drive current through the laser diode LD will have a fast rising edge and a fast exponentially decay as a falling edge. Ringing is not present, preventing the laser diode LD from lasing multiple times in response to a single trigger pulse.

In order to obtain a short pulse with this design, the total inductance Ltot can be lowered, as can be seen from the above equations. However, this is not necessarily possible due to the parasitic inductances present in the laser driver circuit 10. In addition, also note that the capacitance of capacitor C plays an opposite role to the total inductance Ltot—the capacitance is to be reduced to enable production of a narrow pulse. However, this leads to a reduced Ipeak value for the laser drive current through the laser diode LD. Moreover, the greater the capacitance of the capacitor C, the greater the recovery time of the laser driver circuit 10. The peak current Ipeak through the laser diode LD is dependent on VHV, and it is undesirable to increase VHV past a certain point to maintain safe operating area (SOA). It is possible to reduce recovery time by reducing the resistance of the pull up resistor Rpullup. However, this will increase power consumption.

While this prior art laser driver circuit 10 enables the generation of a single laser drive current pulse without ringing, using a relative simple design and with adequate safety margins, it fails to reduce the pulse width of the produced laser drive current sufficiently for some purposes, fails to produce a laser drive current pulse that is as high as desired for some purposes, and has a recovery time longer than desired for some purposes. Therefore, further development is required to address the challenges described above.

SUMMARY

Disclosed herein is a circuit including a laser diode having an anode coupled to a high voltage supply node and a cathode coupled to an output node, a current source coupled between the output node and ground, and at least one clamping circuit coupled between the output node and the high voltage supply node. The current source is configured to turn on in response to a first logic state of a trigger signal and sink current from the high voltage supply node to ground to thereby cause the laser diode to lase, and is configured to turn off in response to a second logic state of the trigger signal. The at least one clamping circuit is configured to clamp voltage at the output node occurring in response to switching of the current source from turned on to turned off.

The current source may include a current generator transistor having a first conduction terminal, a second conduction terminal coupled to ground, and a control terminal coupled to a bias voltage, a switching transistor having a first conduction terminal, a second conduction terminal coupled to the first conduction terminal of the current generator transistor, and a control terminal coupled to receive the trigger signal, and a cascode transistor having a first conduction terminal coupled to the output node, a second conduction terminal coupled to the first conduction terminal of the switching transistor, and a gate coupled to a bias voltage.

The current generator transistor may include a first n-channel transistor having a source coupled to ground, a drain, and a gate coupled to the bias voltage. The switching transistor may include a second n-channel transistor having a source coupled to the drain of the current generator transistor, a drain, and a gate coupled to receive the trigger signal. The cascode transistor may include a third n-channel transistor having a source coupled to the drain of the switching transistor, a drain coupled to the output node, and a gate coupled to the bias voltage.

The at least one clamping circuit may include a first diode having an anode coupled to the output node and a cathode coupled to a first node, a resistor coupled between the first node and a second node, a second diode having an anode coupled to the second node and a cathode coupled to the high voltage supply node, and a switch transistor having a first conduction terminal coupled to the second node, a second conduction terminal coupled to the first node, and a control terminal coupled to the second node through a Zener diode and to the first node through a capacitor (which is parasitic, but a discrete capacitor may additionally be used in some cases).

The switch transistor may include a fourth n-channel transistor having a drain coupled to the first node, a source coupled to the second node, and a gate coupled to the second node through the Zener diode and to the first node through the capacitor.

The at least one clamping circuit may include a selection transistor having a first conduction terminal coupled to the control terminal of the switch transistor, a second conduction terminal coupled to ground, and a gate coupled to a control signal.

The selection transistor may include a fifth n-channel transistor having a drain coupled to the gate of the switch transistor, a source coupled to ground, and a gate coupled to the control signal.

The control terminal of the switch transistor may be coupled to the second node through the Zener diode having an anode coupled to the second node and a cathode coupled to the control terminal of the switch transistor.

The at least one clamping circuit may include a plurality of clamping circuits coupled in parallel between the output node and the high voltage supply node, each of the plurality of clamping circuits being selectable so as to permit a desired number of the plurality of clamping circuits to be enabled while a remainder of the plurality of clamping circuits remain disabled.

Another aspect disclosed herein is directed to a clamping circuit including a first diode having an anode coupled to an output node and a cathode coupled to a first node, a resistor coupled between the first node and a second node, a second diode having an anode coupled to the second node and a cathode coupled to a high voltage supply node, and a switch transistor having a first conduction terminal coupled to the second node, a second conduction terminal coupled to the first node, and a control terminal coupled to the second node through a Zener diode and to the first node through a capacitance (which is parasitic, but a discrete capacitor may additionally be used in some cases).

The switch transistor may include a fourth n-channel transistor having a drain coupled to the first node, a source coupled to the second node, and a gate coupled to the second node through the Zener diode and to the first node through the capacitance.

A selection transistor may have a first conduction terminal coupled to the control terminal of the switch transistor, a second conduction terminal coupled to ground, and a gate coupled to a control signal.

The selection transistor may include a fifth n-channel transistor having a drain coupled to the gate of the switch transistor, a source coupled to ground, and a gate coupled to the control signal.

The control terminal of the switch transistor may be coupled to the second node through the Zener diode having an anode coupled to the second node and a cathode coupled to the control terminal of the switch transistor.

Also disclosed herein is a method including turning on a current source of an underdamped laser driver arranged so that when the current source turns on to cause sinking of current from a laser diode coupled between a high voltage node and an output node, a first current overshoot occurs in the laser diode results in lasing of the laser diode. The method also includes turning off a current source to stop sinking of current from the laser diode by the current source, and to cause a first current undershoot in the laser diode and a first voltage overshoot at the output node. The method further includes after the first current overshoot and in response to the first current undershoot, turning on a clamping circuit with the first voltage overshoot to thereby dampen voltage at the output node.

The clamping circuit may be turned on if the first voltage overshoot is sufficiently high such that an attenuated version of the first voltage overshoot appearing at the gate of a transistor turns on the transistor, and if sufficient voltage headroom between the voltage at the output node and the high voltage node exists to turn on a first diode coupled between the output node and a drain of the transistor and to turn on a second diode coupled between a source of the transistor and the high voltage supply node.

The method may include reducing turn-on time of the laser diode by turning on an additional current source to sink a threshold current from the laser diode a threshold time prior to turning on of the additional current source, the threshold current biasing the laser diode to near, but below, a lasing region, and turning off the additional current source the threshold time after turning off of the current source.

Also disclosed herein is a clamping circuit including a first diode having an anode directly electrically connected to an output node and a cathode directly electrically connected to a first node, a resistor directly electrically connected between the first node and a second node, a second diode having an anode directly electrically connected to the second node and a cathode directly electrically connected coupled to a high voltage supply node, and a switch transistor having a first conduction terminal directly electrically connected to the second node, a second conduction terminal directly electrically connected to the first node, and a control terminal coupled to the second node through a Zener diode and to the first node through a capacitor (which is parasitic, but a discrete capacitor may additionally be used in some cases).

The switch transistor may include a fourth n-channel transistor having a drain directly electrically connected to the first node, a source directly electrically connected to the second node, and a gate coupled to the second node through the Zener diode and to the first node through the capacitor.

A selection transistor may have a first conduction terminal directly electrically connected to the control terminal of the switch transistor, a second conduction terminal directly electrically connected to ground, and a gate directly electrically connected to a control signal.

The selection transistor may include a fifth n-channel transistor having a drain directly electrically connected to the gate of the switch transistor, a source directly electrically connected to ground, and a gate directly electrically connected to the control signal.

The control terminal of the switch transistor may be directly electrically connected to the second node through the Zener diode having an anode directly electrically connected to the second node and a cathode directly electrically connected to the control terminal of the switch transistor.

Also disclosed herein is an integrated circuit chip including a high voltage supply input pin, a supply voltage input pin, a laser diode anode pin for connection to an anode of an external laser diode, a laser diode cathode pin for connection to a cathode of the external laser diode, a current source coupled between an laser diode cathode pin and ground, the current source configured to turn on in response to a first logic state of a trigger signal and sink current from the high voltage supply input pin to ground, and configured to turn off in response to a second logic state of the trigger signal, and at least one clamping circuit coupled between the laser diode cathode pin and the high voltage supply input pin, the at least one clamping circuit configured to clamp voltage at the laser diode cathode pin occurring in response to switching of the current source from turned on to turned off.

The current source may include a current generator transistor having a first conduction terminal, a second conduction terminal coupled to ground, and a control terminal coupled to a first bias voltage, a switching transistor having a first conduction terminal, a second conduction terminal coupled to the first conduction terminal of the current generator transistor, and a control terminal coupled to receive the trigger signal, and a cascode transistor having a first conduction terminal coupled to the laser diode cathode pin, a second conduction terminal coupled to the first conduction terminal of the switching transistor, and a gate coupled to a second bias voltage.

The current generator transistor may include a first n-channel transistor having a source coupled to ground, a drain, and a gate coupled to the bias voltage. The switching transistor may include a second n-channel transistor having a source coupled to the drain of the current generator transistor, a drain, and a gate coupled to receive the trigger signal. The cascode transistor may include a third n-channel transistor having a source coupled to the drain of the switching transistor, a drain coupled to the laser diode cathode pin, and a gate coupled to the second bias voltage.

The at least one clamping circuit may include a first diode having an anode coupled to the laser diode cathode pin and a cathode coupled to a first node, a resistor coupled between the first node and a second node, a second diode having an anode coupled to the second node and a cathode coupled to the high voltage supply input pin, and a switch transistor having a first conduction terminal coupled to the second node, a second conduction terminal coupled to the first node, and a control terminal coupled to the second node through a Zener diode and to the first node through a capacitance (which is parasitic, but a discrete capacitor may additionally be used in some cases).

The switch transistor may include a fourth n-channel transistor having a drain coupled to the first node, a source coupled to the second node, and a gate coupled to the second node through the Zener diode and to the first node through the capacitance.

The at least one clamping circuit may include a selection transistor having a first conduction terminal coupled to the control terminal of the switch transistor, a second conduction terminal coupled to ground, and a gate coupled to a control signal.

The selection transistor may include a fifth n-channel transistor having a drain coupled to the gate of the switch transistor, a source coupled to ground, and a gate coupled to the control signal.

The control terminal of the switch transistor may be coupled to the second node through the Zener diode having an anode coupled to the second node and a cathode coupled to the control terminal of the switch transistor.

The at least one clamping circuit may include a plurality of clamping circuits coupled in parallel between the laser diode cathode pin and the high voltage supply input pin, each of the plurality of clamping circuits being selectable so as to permit a desired number of the plurality of clamping circuits to be enabled while a remainder of the plurality of clamping circuits remain disabled.

Also disclosed herein is a circuit including an input node to be coupled to a cathode of a laser diode having its anode coupled to a high voltage supply node, and a cascoded current mirror having an input branch and an output branch. The input branch is coupled between the high voltage supply node and a sense resistor coupled to the input node, and the output branch is coupled between the high voltage supply node and an output node. A sense resistance is coupled between the output node and ground, with the sense resistance being a diode coupled transistor coupled to the output node and a resistor coupled between the diode coupled transistor and ground. The input branch is configured to generate a current proportional to a voltage drop across the laser diode. The output branch is configured to generate a mirrored current proportional to the current proportional to the voltage drop across the laser diode. A voltage proportional to the voltage drop across the laser diode is generated as a result of the mirrored current flowing through the sense resistance. A comparison circuit is configured to compare the voltage proportional to the voltage drop across the laser diode to a threshold voltage.

The comparison circuit may be configured to assert a fault output if the voltage proportional to the voltage drop across the laser diode exceeds the threshold voltage for a set period of time.

The set period of time may be at least equal to an expected duration of a laser drive current pulse.

The comparison circuit may be configured to assert a fault flag if the voltage proportional to the voltage drop across the laser diode exceeds the threshold voltage.

A bias setting current may be configured to bias cascode transistors of the cascoded current mirror.

Clamp circuits may be configured to protect transistors of the cascoded current mirror against damage.

Also disclosed herein is a circuit including a cascoded current mirror having an input branch and an output branch, and a first sense resistor coupled between the first input branch and an input node. The input node is configured to be coupled to a cathode of a laser diode having its anode coupled to a high voltage supply node. An output node is coupled to the output branch. A sense branch is coupled between the output node and ground. A comparator has a first input coupled to the output node, a second input coupled to a threshold voltage, and an output generating a fault flag.

The cascoded current mirror may include a first p-channel transistor having a drain coupled to the first sense resistor, a source, and a gate. A second p-channel transistor may have a drain coupled to the source of the first p-channel transistor, a source coupled to the high voltage supply node, and a gate coupled to the drain of the first p-channel transistor to define a diode configuration. A third p-channel transistor may have a source coupled to the high voltage supply node, a drain, and a gate coupled to the gate of the second p-channel transistor. A fourth p-channel transistor may have a source coupled to the drain of the third p-channel transistor, a drain coupled to the output node, and a gate coupled to the gate of the first n-channel transistor.

A first Zener diode may have an anode coupled to the source of the first p-channel transistor and the drain of the second p-channel transistor, and a cathode coupled to the high voltage supply node. A second Zener diode may have an anode coupled to the gates of the second and third p-channel transistors, and a cathode coupled to the high voltage supply node. A third Zener diode may have an anode coupled to the source of the fourth p-channel transistor and the drain of the third p-channel transistor, and a cathode coupled to the high voltage supply node. A fourth Zener diode may have an anode coupled to the gates of the first and fourth p-channel transistors, and a cathode coupled to the high voltage supply node.

A bias setting circuit may include a fifth p-channel transistor having a drain coupled to the gates of the first and fourth p-channel transistors, a source coupled to the drain of the first p-channel transistor, and a gate directly coupled to the drain of the fifth p-channel transistor and indirectly coupled to the source of the fifth p-channel transistor through a capacitor. A current source may generate a bias current sunk by the drain of the fifth p-channel transistor.

The sense branch may include a diode coupled p-channel transistor having a source coupled to the output node, a drain, and a gate coupled to the drain of the diode coupled p-channel transistor. A second sense resistor may be coupled between the drain of the diode coupled p-channel transistor and ground.

A fifth Zener diode may have an anode coupled to the ground, and a cathode coupled to the output node.

A digital block may include a delay block configured to receive the fault flag and to output a delayed version of the fault flag, an AND gate having a first input configured to receive the fault flag, a second input configured to receive the delayed version of the fault flag, and an output generating a clock pulse. The digital block may also include a flip flop having a D input coupled to a supply voltage, a clock input coupled to the output of the AND gate, a clear input coupled to a fault clear signal, and an output generating a fault output signal.

Another method aspect disclosed herein is directed to a method of detecting faults in driving of a laser diode. The method includes generating a voltage proportional to a voltage drop across the laser diode, comparing the voltage proportional to the voltage drop across the laser diode to a threshold voltage, and if the voltage proportional to the voltage drop across the laser diode rises and remains above the threshold voltage for a period of time greater than an expected duration of a laser drive current pulse, indicating detection of a fault in the driving of the laser diode.

Generating the voltage proportional to the voltage drop across the laser diode may include generating a current proportional to the voltage drop across the laser diode, and mirroring the current proportional to the voltage drop across the laser diode, across a cascoded current mirror, to produce a mirrored current. The voltage proportional to the voltage drop across the laser diode may be generated as being equal to a voltage drop of the mirrored current across a voltage replication circuit.

The method may also include receiving external input setting the threshold voltage and setting the period of time.

Also disclosed herein is a level shifter including an input node capacitively coupled to a laser driver to receive a signal therefrom indicative of generation of a laser drive pulse, a first p-channel transistor having a source coupled to a supply node, a drain coupled to an output node, and a gate coupled to the input node, and an n-channel transistor having a drain coupled to the drain of the first p-channel transistor, a source coupled to ground, and a gate coupled to the input node. A first switch selectively couples the input node to the output node.

The laser driver is comprised of a laser and clamp circuit that includes a laser diode and clamp, and a cascode current generator coupled to the laser and clamp circuit, the cascode current generator for causing the laser diode to lase. In particular, the cascode current generator includes a driver amplifier (buffer) generating a trigger pulse for a cascoded transistor switch.

This lever shifter is adaptable to both the case where the input node of the level shifter is capacitively coupled to the output of the driver amplifier (buffer) of the cascode current generator, or where the input node of the level shifter is capacitively coupled to the drain of the cascoded transistor switch.

In the case where the input node of the level shifter is capacitively coupled to the output of the driver amplifier (buffer), the level shifter includes a second p-channel transistor has a source coupled to the supply node, a drain selectively coupled to the output node by a second switch, and a gate coupled to the input node. The first switch closes and the second switch opens when the signal indicative of generation of a laser drive pulse is low. The first switch opens and the second switch closes when the signal indicative of generation of a laser drive pulse is high.

In the case where the input node of the level shifter is capacitively coupled to the drain of the cascoded transistor switch, the level shifter includes a second n-channel transistor having a source coupled to ground, a drain selectively coupled to the output node by a second switch, and a gate coupled to the input node. The first switch closes and the second switch opens when the signal indicative of generation of a laser drive pulse is low. The first switch opens and the second switch closes when the signal indicative of generation of a laser drive pulse is high.

A buffer may have an input coupled to the output node.

A first current source may generate a current proportional to absolute temperature, the first current source biasing the buffer with the current proportional to absolute temperature.

Also disclosed herein is a level shifter including an input node capacitively coupled to a laser driver to receive a signal therefrom indicative of generation of a laser drive pulse, and an inverter. The inverter has an input coupled to the input node and an output coupled to an output node, the inverter having adjustable threshold voltage that increases when the signal on the input node goes high and decreases when the signal on the input node returns low.

In particular, the inverter is formed from a p-channel transistor and n-channel transistor. The p-channel transistor has a source coupled to a supply voltage, a drain coupled to the output node, and a gate coupled to the input node. The n-channel transistor has a drain coupled to the output node, a source coupled to ground, and a gate coupled to the input node. A first switch is coupled between the input node and output node. A threshold altering transistor (which may be p-channel or n-channel) has its source selectively coupled to the output node by a second switch, and its gate coupled to the input node. If the threshold altering transistor is n-channel, then its drain is coupled to the supply voltage, whereas if the threshold altering transistor is p-channel, then its drain is coupled to ground.

The threshold of the inverter is adjusted as a consequence of the switching of the first and second switches that is in turn an indirect consequence of the signal on the input node. This is an indirect consequence since, when a trigger pulse for an AC coupled laser driver is generated, an analog signal is generated and AC coupled to the input node, and it is this trigger pulse that drives the generation of a control signal for the first and second switches.

The level shifter may include a buffer having an input coupled to the output node, and a first current source generating a current proportional to absolute temperature, the first current source biasing the buffer with the current proportional to absolute temperature.

Also disclosed herein is a time of flight ranging system including a laser diode, a laser driver configured to generate a laser drive pulse for the laser diode to cause the laser diode to generate a laser pulse, a receiver, and a level shifter. The level shifter includes an input node capacitively coupled to the laser driver to receive a signal therefrom indicative of generation of a laser drive pulse. An inverter has an input coupled to the input node and an output coupled to an output node, the inverter also having adjustable threshold voltage that increases when the signal on the input node goes high and decreases when the signal on the input node returns low. A time to digital converter is configured to begin counting based upon output received from the level shifter, to stop counting when the receiver detects the laser pulse after the last pulse has reflected off an object, and to determine a distance to the object based upon the count.

The laser driver is comprised of a laser and clamp circuit that includes a laser diode and clamp, and a cascode current generator coupled to the laser and clamp circuit, the cascode current generator for causing the laser diode to lase. In particular, the cascode current generator includes a driver amplifier (buffer) generating a trigger pulse for a cascoded transistor switch.

This time of flight ranging system is adaptable to both the case where the input node of the level shifter is capacitively coupled to the output of the driver amplifier (buffer) of the cascode current generator, or where the input node of the level shifter is capacitively coupled to the drain of the cascoded transistor switch.

In the case where the input node of the level shifter is capacitively coupled to the output of the driver amplifier (buffer), the inverter includes a first p-channel transistor having a source coupled to a supply node, a drain coupled to the output node, and a gate coupled to the input node, and an n-channel transistor having a drain coupled to the drain of the first p-channel transistor, a source coupled to ground, and a gate coupled to the input node. A first switch selectively couples the input node to the output node. A second p-channel transistor has a source coupled to the supply node, a drain selectively coupled to the output node by a second switch, and a gate coupled to the input node. The first switch closes and the second switch opens when the signal indicative of generation of a laser drive pulse is low. The first switch opens and the second switch closes when the signal indicative of generation of a laser drive pulse is high.

In the case where the input node of the level shifter is capacitively coupled to the drain of the cascoded transistor switch, the inverter includes a first p-channel transistor having a source coupled to a supply node, a drain coupled to the output node, and a gate coupled to the input node, and an n-channel transistor having a drain coupled to the drain of the first p-channel transistor, a source coupled to ground, and a gate coupled to the input node. A first switch selectively couples the input node to the output node. A second n-channel transistor has a source coupled to ground, a drain selectively coupled to the output node by a second switch, and a gate coupled to the input node. The first switch closes and the second switch opens when the signal indicative of generation of a laser drive pulse is low. The first switch opens and the second switch closes when the signal indicative of generation of a laser drive pulse is high.

In both cases, note that the threshold of the inverter is adjusted as a consequence of the switching of the first and second switches that is in turn an indirect consequence of the signal on the input node. This is an indirect consequence since, when the trigger pulse is generated, an analog signal is generated and AC coupled to the input node, and it is this trigger pulse that drives the generation of a control signal for the first and second switches.

A buffer may have an input coupled to the output node.

A first current source may generate a current proportional to absolute temperature, the first current source biasing the buffer with the current proportional to absolute temperature.

Also disclosed herein is a method of operating a level shifter capacitively coupled to a laser driver. The method includes in a steady state, coupling an input and an output of an inverter within the level shifter to one another to thereby set the input and output of the inverter to a threshold voltage. The method also includes when a signal from the laser driver goes high, increasing the threshold voltage of the inverter to protect the input of the inverter from noise. When the signal from the laser driver goes low, the threshold voltage of the inverter is returned to its original level.

The method may also include buffering the output of the inverter using a buffer biased by a current proportional to absolute temperature so that transmission delay of the buffer decreases as temperature increases, to thereby compensate for transmission delays within the laser driver and within the level shifter that increase as temperature increases.

Increasing the threshold voltage of the inverter may include coupling an additional p-channel transistor in parallel with a p-channel transistor of the inverter, and returning the threshold voltage of the inverter to its original level may include decoupling the additional p-channel transistor from the p-channel transistor of the inverter.

Increasing the threshold voltage of the inverter may alternatively include coupling the drain of an additional n-channel transistor to the drain of a p-channel transistor of the inverter, coupling the source of the additional n-channel transistor to ground, and coupling the gate of the additional n-channel transistor to the gate of the p-channel transistor of the inverter.

A level shifter disclosed herein includes an input node capacitively coupled to a laser driver to receive a signal therefrom indicative of generation of a laser drive pulse, a p-channel transistor having a source coupled to a supply node, a drain coupled to an output node, and a gate coupled to the input node. A first n-channel transistor may have a drain coupled to the drain of the p-channel transistor, a source coupled to ground, and a gate coupled to the input node. The level shifter may also include a first switch selectively coupling the input node to the output node, and a second n-channel transistor having a source coupled to ground, a drain selectively coupled to the output node by a second switch, and a gate coupled to the input node. The first switch may close and the second switch open when the signal indicative of generation of a laser drive pulse is low. The first switch may opens and the second switch close when the signal indicative of generation of a laser drive pulse is high.

A buffer may have an input coupled to the output node.

A first current source may generate a current proportional to absolute temperature, the first current source biasing the buffer with the current proportional to absolute temperature.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Any nodes referred to herein may optionally be considered to be coupled to pins for connection to external components in some cases. Certain specific voltages referred to herein (VHV, ground, VCC, VBIAS, pulses received by driver amplifier 21 or amplifier 46, etc) may optionally be considered to be received from an external voltage source in some cases, such as through a pin or pins connected to an external voltage source.

Figure 2:
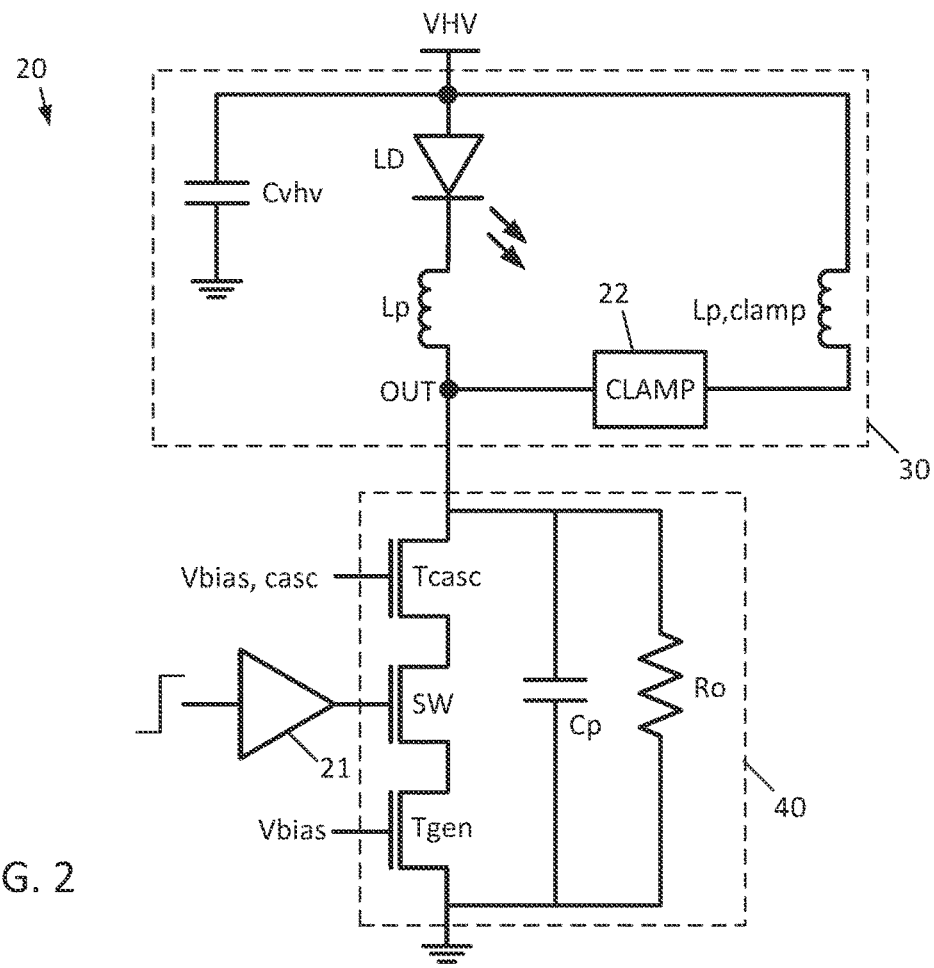
FIG. 2 is a schematic diagram of a laser driving circuit for generation of a drive pulse for a laser diode, according to this disclosure.

Now described with reference to FIG. 2 is a laser driver circuit 20 for a laser diode LD. The laser driver circuit 20 is comprised of a cascode current generator 40 coupled in series between an output node OUT and ground, and a laser and clamp circuit 30 coupled in series between a high voltage supply node VHV and the output node OUT.

The laser and clamp circuit 30 includes a capacitor Cvhv coupled between the high voltage supply node VHV and ground. A laser diode LD has its anode coupled to the high voltage supply node VHV and its cathode coupled to the output node OUT. A parasitic inductance Lp, that represents a sum of the parasitic inductances in the series path of the laser diode LD between the output node OUT and the high voltage supply node VHV (e.g., sum of the parasitic inductance of the laser diode LD, the parasitic inductance of the PCB traces between the output node OUT and the supply node VHV in the path of the laser diode LD), is illustrated as being coupled between the cathode of the laser diode LD and the output node OUT, but it should be understood that inductance Lp represents parasitic inductances (as described) and is not a discrete component. As an alternative, the inductance Lp may also include a discrete inductive element, in which case it would represent the prior mentioned sum of parasitic inductances as well as the inductance of the discrete inductive element, however, for the purposes of the remainder of this disclosure, the case where the inductance Lp does not include a discrete inductive element is instead considered.

A clamping circuit 22 is coupled between the output node OUT and the high voltage supply node VHV; therefore, the clamping circuit 22 is coupled in parallel with the laser diode LD. A parasitic inductance Lp,clamp, that represents a sum of all parasitic inductances in the series path of the clamping circuit 22 between the output node OUT and the high voltage supply node VHV (e.g., sum of the parasitic inductance of the clamping circuit 22, the parasitic inductance of the PCB traces between the output node OUT and the supply node VHV in the past of the clamping circuit 22), is illustrated as being coupled between clamping circuit 22 and the high voltage supply node VHV, but it should be understood that the inductance Lp,clamp represents parasitic inductances (as described) and is not a discrete component. As an alternative, the inductance Lp,clamp may also include a discrete inductive element, in which case it would represent the prior mentioned sum of parasitic inductances as well as the inductance of the discrete inductive element, however, for the purposes of the remainder of this disclosure, the case where the inductance Lp,clamp does not include a discrete inductive element is instead considered.

The cascode current generator 40 includes a current generator Tgen (which is an n-channel transistor) having its source coupled to ground and its gate biased by a first bias voltage Vbias. A switch SW (which is an n-channel transistor) has its source coupled to the drain of transistor current generator Tgen and its gate controlled by a trigger pulse from a driver amplifier 21. A cascode device Tcasc (which is an n-channel transistor) has its source coupled to the drain of switch SW, its gate biased by a second bias voltage Vbias,casc, and its drain coupled to the output node OUT.

A parasitic capacitance Cp is illustrated as being coupled between the output node OUT and ground, and represents the total parasitic capacitance seen at the output node OUT (e.g., a sum of the output capacitance of the cascode current generator 40, capacitance of the laser diode LD, and capacitance of the PCB lines). An output resistance Ro is shown, and represents the total output resistance seen at the output node OUT (e.g., when the cascode current generator 40 is on, resistance Ro represents the output resistance of cascode current generator 40 and the laser diode LD in parallel).

Operation of the laser driver circuit 20 is now described. Initially, consider that the capacitor Cvhv is a filtering capacitor for the high voltage supply VHV, used to maintain the voltage at the anode of the laser diode LD substantially constant. When the trigger pulse for the switch SW is low, turning the switch SW off, the cascode current generator 40 is off and no current is sinked from the output node OUT. Therefore, there is no current path from the high voltage supply VHV to ground through the laser diode LD, and the laser diode LD is therefore off.

Neglecting for the moment the path of the clamp circuit 22, when the trigger pulse for the switch SW goes high, the switch SW turns on, turning on the cascode current generator 40 to sink current from the high voltage supply VHV to ground through the laser diode LD.

Figure 1A:
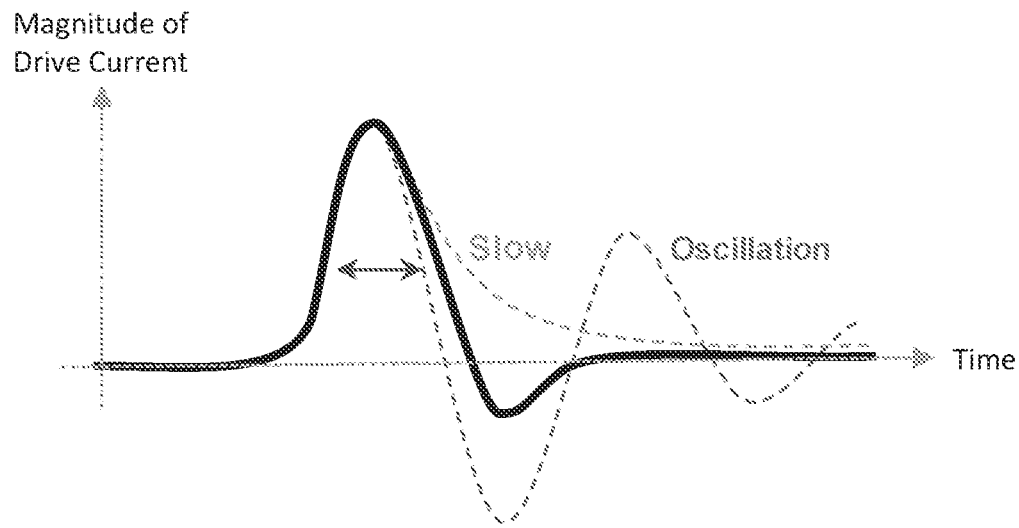
FIG. 1A is a graph of a sample drive pulse for a laser diode, according to the prior art.

The laser driver circuit 20 can be described as an RLC circuit that is sized to be intentionally under-damped. This means the shape of the laser drive current through the laser diode LD will match that of the steeply rising and decaying dashed waveform in FIG. 1A. As compared to the prior art laser driver of FIG. 1B, the design of the laser driver circuit 20 exploits under-dampening so that a resulting under-damped laser drive current will have a first current overshoot with performance unobtainable by the prior art laser driver of FIG. 1B in terms of pulse width and maximum value. The advantages become present from the following equations, assuming that the inductance value Lp is 1 nH, that the peak laser drive current Ipeak is 20 A, that the power width at half maximum is 1 ns, that the rise time Trise of the laser drive current is 0.5 ns, that Ro is 1KΩ, and that Cp is 55 pF (and therefore $$\varepsilon = \frac{1}{2*Ro} * \sqrt{\frac{Lp}{Cp}} = 0.0101 \Bigg).$$

$$PWHM = \pi * \sqrt{Lp*Cp} = 736 \text{ ps}$$

$$Ipeak = 2*Io \rightarrow Io = 10 \text{ A}$$

$$Vhv > Vcc - Vth, casc + Lp * \frac{dIlp}{dt} + Vf, LD \rightarrow Vhv = 54 \text{ V}$$

Figure 1B:
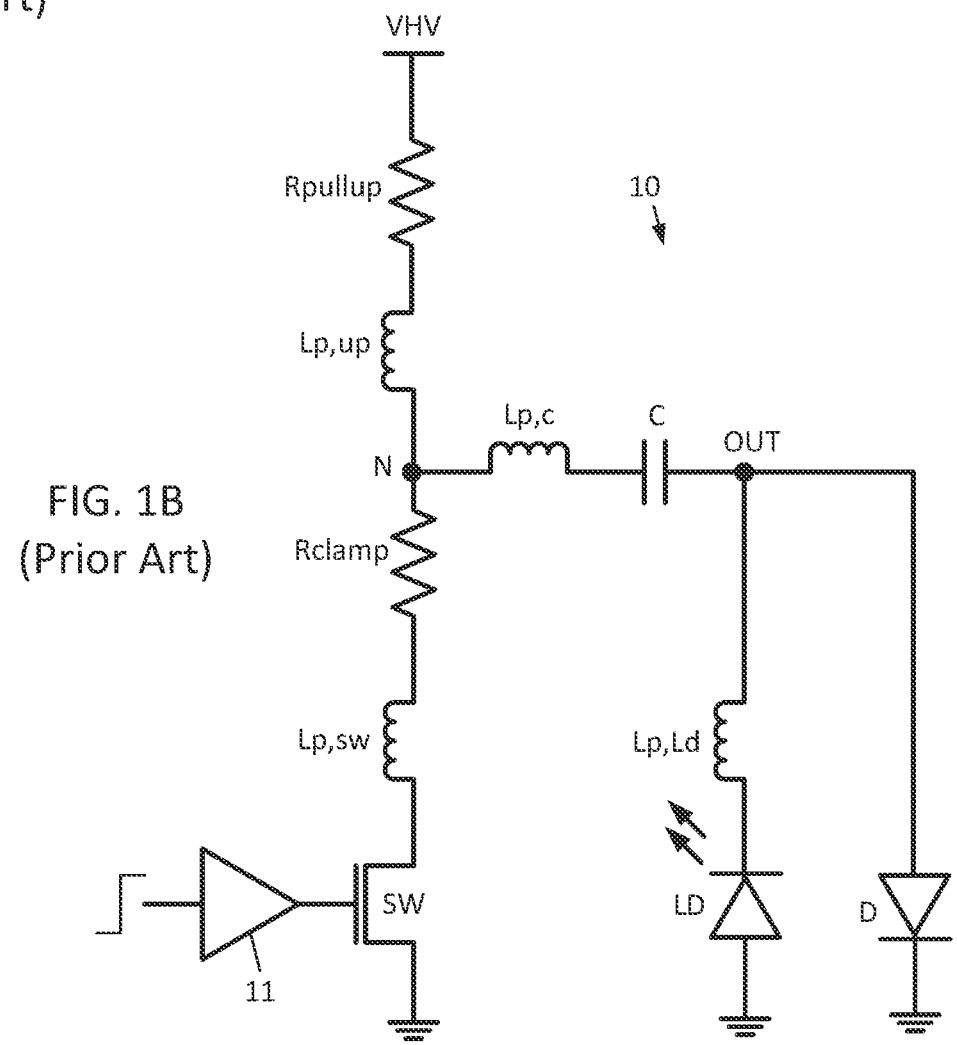
FIG. 1B is a schematic diagram of a laser driving circuit for generation of a drive pulse for a laser diode, according to the prior art.

As can be seen, PWHM is dependent on the parasitic inductance Lp and the parasitic capacitance Cp that will be lower than the value of the capacitor C present in the prior art laser driver of FIG. 1B. Therefore, PWHM is narrowed by reducing parasitic elements, without a trade-off. Moreover, the amplitude of this over-shoot is (at first order) dependent solely on the value of the bias current Io (Ipeak~=2*Io) and can be freely sized (and made programmable if desired). Still further, the peak laser drive current Ipeak and PWHM can be sized independently of one another. Also, the capacitance Cvhv does not utilize recharging as does the capacitor C present in the prior art laser driver of FIG. 1B. This in turn means that the obstacles faced by the prior art laser driver of FIG. 1B in terms of the increase of repetition rate of the laser pulse have been overcome.

The basic principle of operation of the laser driver circuit 20 is to maintain the cascode current generator 40 as on solely during the PWHM time in order to realize a strongly under-damped laser driver circuit 20. In this context, as stated, the first overshoot of the under-damped laser drive current is utilized as the drive pulse. To prevent the ringing that would otherwise occur, the clamping circuit 22 is used. The laser driver circuit 20 is dependent upon the state (and not just an edge) of the trigger pulse because the laser drive current is switched off when the switch SW is turned off, and therefore the trigger pulse width is to be sufficient for the laser drive current to reach the desired peak laser drive current value but is to then be pulled low in order to produce a true current overshoot with a sharp falling edge.

Consider a hypothetical case in which the trigger pulse has a long pulse width. In this case, after experiencing an overshoot with a sharp rising edge, the laser drive current will reach a stable DC condition, and a DC current will be sunk from the high voltage supply node VHV through the laser diode LD. Therefore, it can be seen that compared to the prior art laser driver of FIG. 1B, the laser driver circuit 20 does not automatically switch itself off, and therefore the switch SW is to be closed as soon as the desired peak laser drive current is reached to produce a sharp falling edge. Due to this, note that the generation of the trigger pulse is to take this into account.

Turning now to the under-damped nature of the laser drive current, after switching off of the switch SW to remove the bias current drawn by the cascode current generator 40, the laser drive current effectively falls to zero with a sharp falling edge. However, after this, due to under-damped nature of the laser driver circuit 20, several following current undershoots and overshoots would otherwise be present (as can be seen in the dashed waveform of FIG. 1A). This additional current overshoot can be sufficiently high to cause the laser diode LD to lase more than once per trigger pulse, which is unacceptable for a ranging application.

Figure 3:
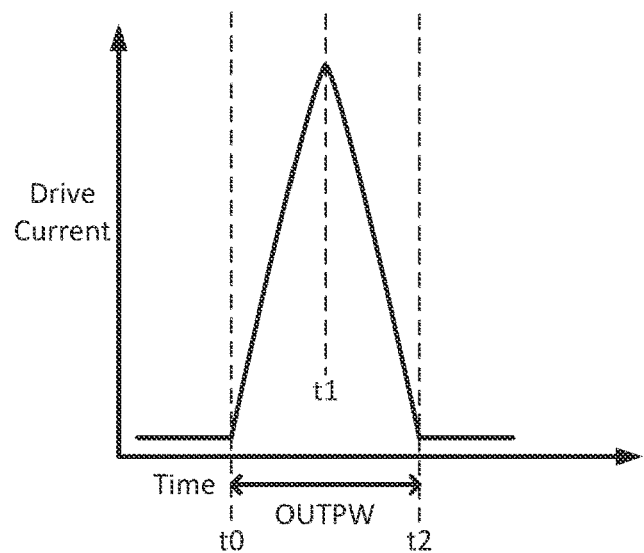
FIG. 3 is a graph of the drive current pulse produced by the laser driving circuit of FIG. 2.

A graph of the desired drive current over time can be seen in FIG. 3. The drive current pulse rises at time t0 into the lasing region (e.g., results in the laser diode LD lasing) to peak at time t1, and falls back down below the lasing region to a nominal or zero level by time t2. As can be seen, the rise and fall of the drive current pulse are sharp, the pulse width OUTPW is narrow, and oscillation or ringing is not present.

As stated, the laser driver circuit 20 is under-damped so as to permit exploitation of the first current overshoot as the effective laser drive pulse. The trigger pulse for the switch SW is a monostable pulse with a pulse width sufficient to allow the laser drive current to reach the desired current peak value Ipeak, but not more than this level, so as to produce the desired sharp falling edge in the laser drive current. The under-damped behavior of the RLC equivalent circuit of the laser driver circuit 20 is present in the laser drive current and therefore in the voltage of the output node OUT.

In other words, the voltage at the output node OUT will show a negative spike (a voltage undershoot) during the first current overshoot followed by a relevant positive spike (voltage overshoot) during the first current undershoot. The waveform of the voltage at the output node OUT and the waveform of the laser drive current will show a similar behavior with a phase shift. The aim of the clamping circuit 22 is therefore to dampen the voltage ringing on the output node OUT similar to the damping performed on the bold waveform in FIG. 1A.

The clamping circuit 22 is now described with reference to FIG. 4, which shows the laser driver circuit 20'.

Note that the cascode current generator 40 and clamping circuit 22 are on a single integrated circuit 50, and the laser diode LD and capacitor Cvhv are external to the single integrated circuit 50. In addition, note that the laser driver circuit 20' may include multiple clamping circuits 22 coupled in parallel between the high voltage node VHV and the output node OUT. Each clamping circuit 22 receives its own control signal CTRL, with it being understood that the number of active clamping circuits 22 is programmable via the control signals CTRL—when a given clamping circuit 22 has its control signal CTRL set to a logic low, that clamping circuit 22 is activated, whereas when a clamping circuit 22 has its control signal CTRL set to a logic high, that clamping circuit is deactivated.

Each clamping circuit 22 may be identical, and therefore have identical RLC characteristics. However, in some instances, different clamping circuits 22 may have different RLC values (such as by varying the size or layout of transistor switch Tsw, etc).

Similarly, although one cascode current generator 40 is illustrated, there may be multiple such cascode current generators 40 coupled in parallel between the output node OUT and ground. Cascode current generators 40 which are desired to be off have the gate of their switch SW tied to ground, while cascode current generators 40 which are desired to operate in parallel receive the same pulse trigger. Therefore, the number of active cascode current generators 40 is programmable.

The layout and operation of a single clamping circuit 22 is now described. A parasitic inductance Lp1, that represents a sum of all parasitic in the series path of the capacitor Cvhv between the high voltage supply node VHV and ground (e.g., sum of the parasitic inductance of the capacitor Cvhv, the parasitic inductance of the PCB traces between the high voltage supply node VHV and ground), is illustrated as being coupled between the capacitor Cvhv and ground, but it should be understood that the inductance Lp1 represents parasitic inductances (as described) and is not a discrete component. As an alternative, the inductance Lp1 may also include a discrete inductive element, in which case it would represent the prior mentioned sum of parasitic inductances as well as the inductance of the discrete inductive element, however, for the purposes of the remainder of this disclosure, the case where the inductance Lp1 does not include a discrete inductive element is instead considered.

A laser diode LD has its anode coupled to the high voltage supply node VHV and its cathode coupled to the output node OUT. A parasitic inductance Lp, that represents a sum of the parasitic inductances in the series path of the laser diode LD between the output node OUT and the high voltage supply node VHV (e.g., sum of the parasitic inductance of the laser diode LD, and the parasitic inductance of the PCB traces between the output node OUT and the high voltage supply node VHV), is illustrated as being coupled between the cathode of the laser diode LD and the output node OUT, but it should be understood that the inductance Lp represents parasitic inductances (as described) and is not a discrete component. As an alternative, the inductance Lp may also include a discrete inductive element, in which case it would represent the prior mentioned sum of parasitic inductances as well as the inductance of the discrete inductive element, however, for the purposes of the remainder of this disclosure, the case where the inductance Lp does not include a discrete inductive element is instead considered.

The cascode current generator 40 remains unchanged from that of FIG. 2 and is therefore not described again for brevity.

Figure 4:
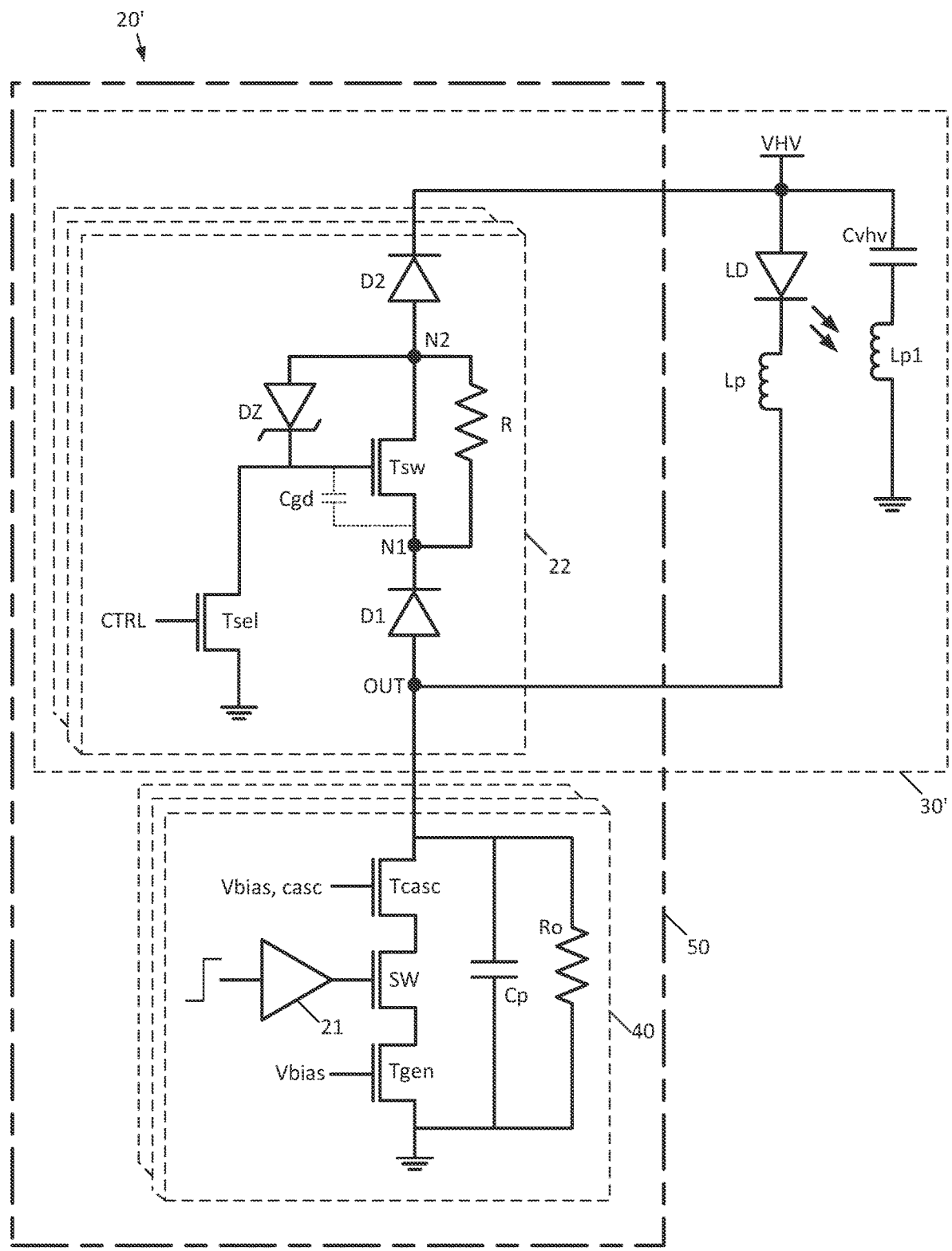
FIG. 4 is a schematic diagram of a laser driving circuit for generation of a drive pulse for a laser diode, according to this disclosure.

The clamping circuit 22, as shown in FIG. 4, includes a switch Tsw (which is an n-channel transistor) having a drain coupled to node N1, a source coupled to node N2, and a gate. A Zener diode DZ has its anode coupled to node N2 and its cathode coupled to the gate of transistor switch Tsw. A selection transistor Tsel (which is an n-channel transistor) has its source coupled to ground, its drain coupled to the gate of the switch Tsw, and its gate coupled to receive the control signal CTRL. A diode D2 has its anode coupled to node N2 and its cathode coupled to the high voltage supply node VHV. A diode D1 has its anode coupled to the output node OUT and its cathode coupled to node N1. A resistor R is coupled between nodes N1 and N2.

Operation is now described. Consider the first voltage overshoot on the output node OUT that is associated with the first current undershoot after the first current overshoot, keeping in mind that the first current overshoot is used to drive the laser diode LD into the lasing region.

When the voltage overshoot at the output node OUT is sufficiently high, it is transferred through diode D1 in an attenuated fashion to node N1. Via the capacitor Cgd and the resistance R, the voltage overshoot at the output node OUT is respectively transferred to the gate of the switch Tsw and node N2.

The capacitor Cgd and resistor R are sized such that the gate of the switch Tsw, in response, rises higher than its source terminal (coupled to node N2). Therefore, once this gate to source voltage becomes sufficient, the switch Tsw turns on. For purposes of this explanation, CTRL remains low during operation, and therefore the transistor Tsel remains off and does not pull the gate of the switch Tsw to ground.

Once the switch Tsw turns on from the voltage overshoot, the voltage between the output node OUT and the high voltage supply node VHV provides headroom to turn on diodes D1 and D2, establishing a discharge path for the voltage overshoot (from the output node OUT to the high voltage node VHV) and therefore damping the voltage overshoot (and the current undershoot).

In summary, after the first current overshoot and in response to the first current undershoot, the active clamp path resulting from CTRL being low is turned on by the voltage overshoot on the output node OUT, thereby damping the voltage at the output node OUT.

As briefly explained above, the damping provided by the clamp path (between the high voltage node VHV and the output node OUT) can be programmed. For instance, for the example application disclosed herein, that there are seven identical instances of the clamping circuit 22 coupled in parallel between the high voltage node VHV and the output node. The programmability of the number of active clamping circuits (by setting the control signal CTRL, for each clamping circuit desired to be activated, low). This allows the proper damping for the behavior of the laser driver circuit 20' to be achieved.

To turn off or deselect a given clamping circuit 22, the control signal CTRL is set to high, turning on the n-channel transistor Tsel, which forces the gate of the switch Tsw to ground with a sufficiently low impedance. In this condition, an overshoot occurring at the output node OUT and transferred to node N1 through the diode D1 is unable to be further transferred to the gate of the switch Tsw. Therefore, the switch Tsw is not turned on by an overshoot occurring at the output node OUT, and the unselected clamping circuit 22 is consequently turned off and does not offer a path to discharge overshoot at the output node OUT to VHV.

While in the example above, each clamping circuit 22 is identical, in some cases, the clamping circuits 22 may be different with one another in terms of sizing of Tsw, R, D1, and D2.

Figure 5:
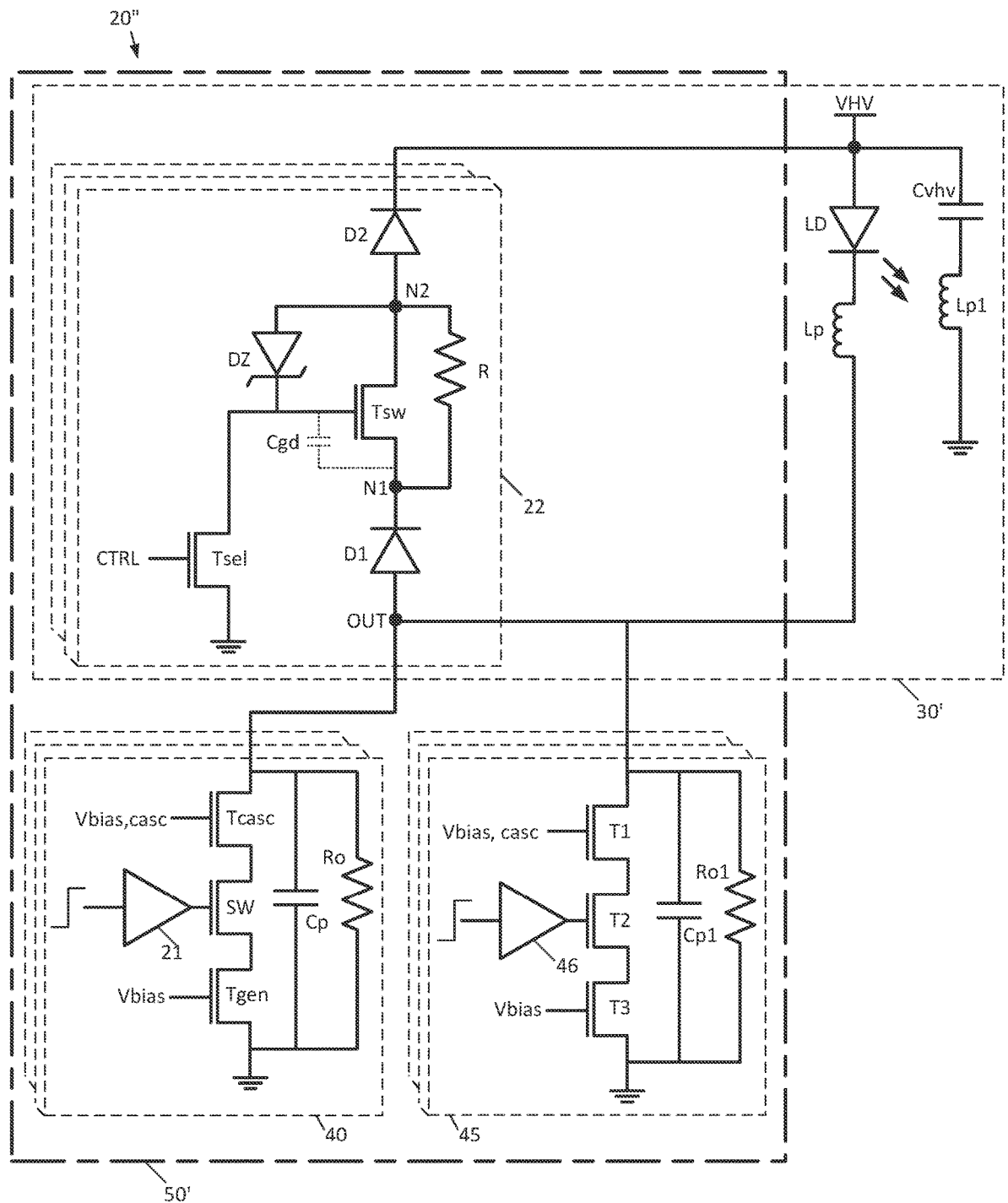
FIG. 5 is a schematic diagram of a variant of a laser driving circuit for generation of a drive pulse for a laser diode, according to this disclosure.

As shown in FIG. 5, due to the design of the laser driver circuit 20', a variant of the laser driver circuit 20" disclosed herein performs a pre-biasing the laser diode LD with a current (from a lasing threshold biasing circuit 45) sufficient to maintain a forward bias on the laser diode LD of just below the lasing region. This allows a large reduction of the turn-on time of the laser diode LD, and in turn allows an increase in the repetition rate of the laser pulses produced by the laser diode LD, as well as allowing the narrowing of the pulse width of the laser pulse output by the laser driver LD.

The lasing threshold biasing circuit 45 is coupled in parallel with the cascode current generator 40 and has a similar structure. In particular, the lasing threshold biasing circuit 45 includes a current generator T3 (which is an n-channel transistor) having its source coupled to ground and its gate biased by a first bias voltage Vbias. A switch T2 (which is an n-channel transistor) has its source coupled to the drain of transistor current generator T3 and its gate controlled by a threshold trigger pulse from an amplifier 46. A cascode device (which is an n-channel transistor) T1 has its source coupled to the drain of switch T2, its gate biased by a second bias voltage Vbias, casc, and its drain coupled to the output node OUT.

A parasitic capacitance Cp1 is illustrated as being coupled between the output node OUT and ground, and represents the total parasitic capacitance related to the lasing threshold biasing circuit 45 at the output node OUT when the lasing threshold biasing circuit 45 is activated (e.g., the output capacitance of the lasing threshold biasing circuit 45). An output resistance Ro1 is shown, and represents the total output resistance seen at the output node OUT (e.g., when the lasing threshold biasing circuit 45 is on, resistance Ro1 represents the output resistance of the lasing threshold biasing circuit 45).

Figure 6:
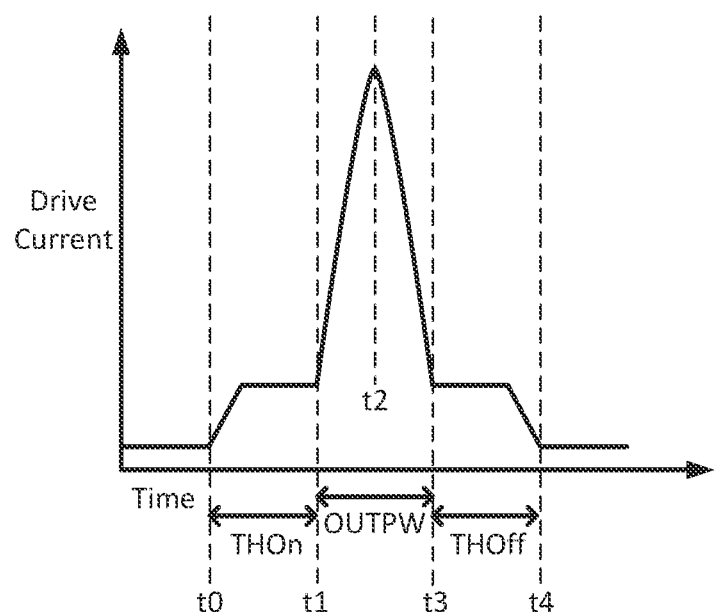
FIG. 6 is a graph of a drive current pulse produced by the laser driving circuit of FIG. 5.

Operation of the lasing threshold biasing circuit 45 is now described with additional reference to FIG. 6. The threshold trigger pulse will go high a time THON before the trigger pulse goes high, turning on the switch T2 and therefore the lasing threshold biasing circuit 45, with the result being that a threshold current will be sunk from the laser diode LD, and will serve to bias the laser diode LD to just below the lasing region (shown occurring between times t0 and t1). The threshold trigger pulse will go low a time THOFF after the trigger pulse goes low (shown occurring between times t3 and t4), in order to remove the threshold current after the trigger pulse has completed, so as to save power. It is possible to simply have the lasing threshold biasing circuit 45 maintained on regardless of the logic state of the trigger pulse, however, this would undesirably consume power.

Those above-described laser driver circuits 20, 20', 20" may be used in any laser driving application where it is desired to drive a laser diode in the described modes. Example applications include a time of flight ranging system incorporating one of the above-described laser driver circuits 20, 20', 20" to drive one or more laser diodes, and a LIDAR ranging system incorporating one of the above-described laser driver circuits 20, 20', 20" to drive one or more laser diodes.

As stated, prior art laser driver designs enable the generation of a pulsed drive current for a laser diode without ringing, but they fail to reduce the pulse width of the produced laser drive current sufficiently for some purposes, fail to produce a laser drive current pulse that is as high as desired for some purposes, and have a recovery time longer than desired for some purposes. As also explained herein, it is possible to design an underdamped pulse triggered (as opposed to edge triggered) laser driver topology that generates a very narrow laser drive current pulse.

Due to this pulse triggered design, this newly designed laser driver is sensitive to state of the pulse trigger it receives as input, which raises potential issues. A potential fault can originate externally (from the circuitry generating the pulse trigger) or can originate internally (due to a logic problem). If such a fault were to cause the pulse trigger to remain fixed at a logic high for longer than desired, a large DC current will flow through the laser diode, which in turn will emit a fixed (as opposed to pulsed) laser beam. A fixed laser beam is undesirable for a variety of reasons as it would exceed established laser power regulations, and as it would lead to self-heating of the driver circuitry in excess of what the driver circuitry is designed to withstand.

Another potential issue lies in the fact that this newly designed laser driver has the anode of the laser diode coupled to the highest DC voltage, meaning that an above-described fault that leads to the cathode of the laser diode being forced to a lower voltage could result in sufficient forward bias to turn on the laser diode.

Therefore, in summary, the two potential issues with the newly designed laser driver arise from the fact that it is pulse triggered, and from the fact that the laser diode is placed so as to naturally enter a forward bias mode. These potential issues are addressed by the safety circuitry 100 of FIG. 7, which has been developed to eliminate these potential issues.

Figure 7:
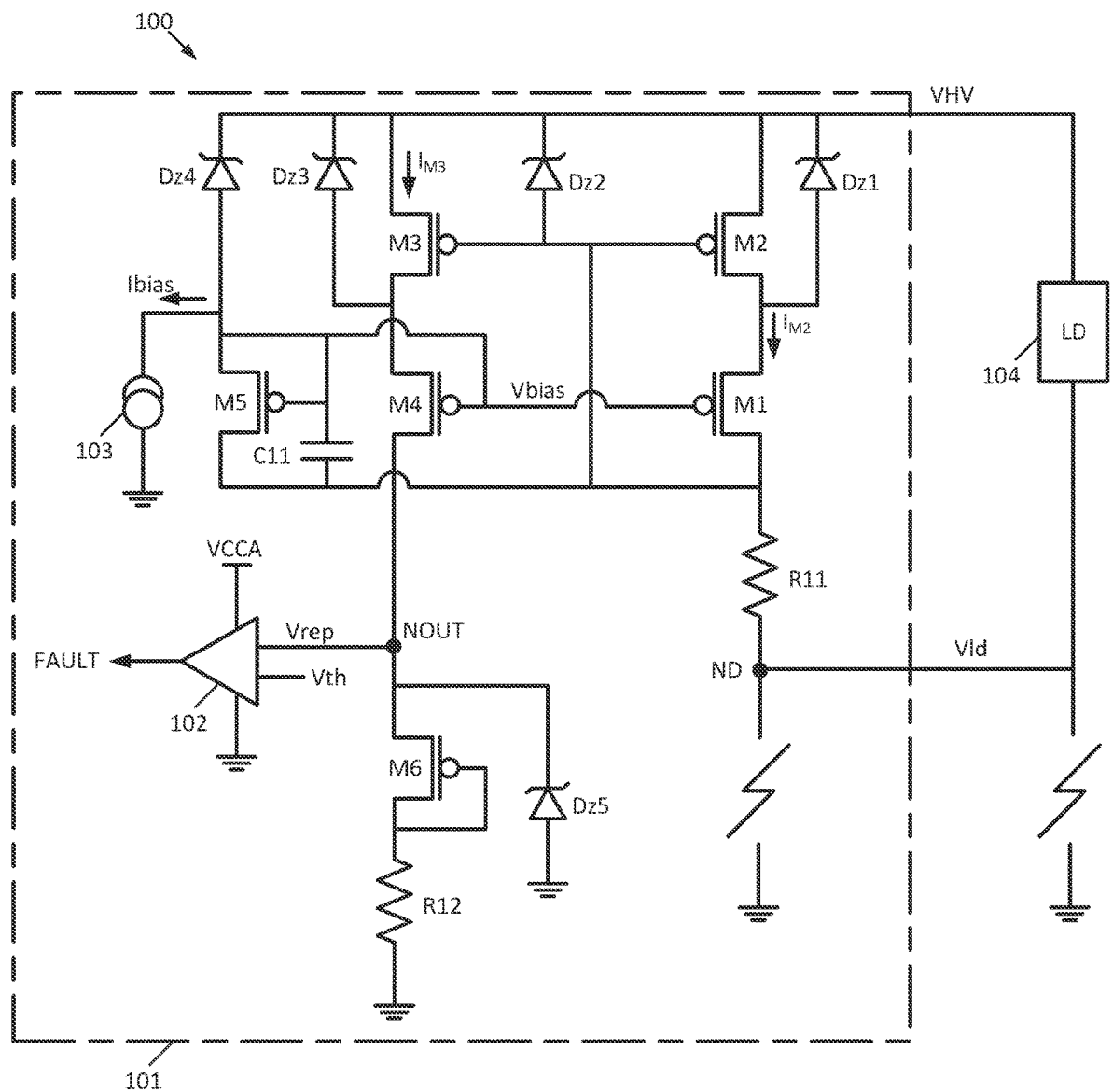
FIG. 7 is a schematic diagram of safety circuitry disclosed herein for determining whether a fault has occurred in operation of the laser driving circuits described above.
Figure 7:
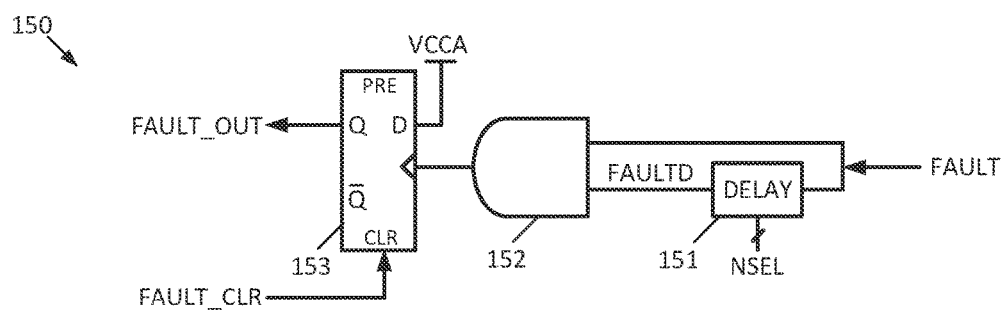

Referring now to FIG. 7, the safety circuitry 100 includes a p-channel transistor M2 having its source coupled to a high voltage node VHV, its drain coupled to the source of p-channel transistor M1, and its gate coupled to its drain through p-channel transistor M1 as well as to the gate of p-channel transistor M3. The p-channel transistor M1 has its source coupled to the drain of the p-channel transistor M2, its drain coupled to the resistor R11, and its gate coupled to the gate of the p-channel transistor M4. The resistor R11 is coupled between the drain of the p-channel transistor M1 and node ND—note that the laser diode 104 driven by the laser driver is coupled between VHV and node ND, and is external to the safety circuitry 100 and external to the integrated circuit 101 in which the safety circuitry 100 is contained. Node ND is coupled to ground in the absence of a fault internal to the integrated circuit 101.

The p-channel transistor M3 has its source coupled to the high voltage node VHV, its drain coupled to the source of p-channel transistor M4, and its gate coupled to the gate and drain of p-channel transistor M2. The p-channel transistor M4 has its source coupled to the drain of the p-channel transistor M3, its drain coupled to an output node NOUT, and its gate coupled to the gate of p-channel transistor M1.

A p-channel transistor M5 has its drain coupled to the gates of the p-channel transistors M4 and M1, its source coupled to the gates of p-channel transistors M2-M3 as well as to the drain of p-channel transistor M1, and its gate coupled directly to its drain and indirectly to its source through capacitor C11. A current source 103 is coupled between the drain of the p-channel transistor M5 (and the gate of the p-channel transistor M4) and ground.

A Zener diode Dz1 has its anode coupled to the drain of the p-channel transistor M2 and source of the p-channel transistor M1, and its cathode coupled to the high voltage supply node VHV. A Zener diode Dz2 has its anode coupled to the gates of the p-channel transistors M2 and M3 as well as to the drain of p-channel transistor M1 and the source of p-channel transistor M5, and its cathode coupled to the high voltage supply node VHV. A Zener diode Dz3 has its anode coupled to the drain of the p-channel transistor M3 and source of the p-channel transistor M4, and its cathode coupled to the high voltage supply node VHV. A Zener diode Dz4 has its anode coupled to the current source 103, the drain of the p-channel transistor M5, and the gate of the p-channel transistor M4, and its cathode coupled to the high voltage supply node VHV.

A comparator 102 has a first input coupled to the output node NOUT, a second input coupled to receive a threshold voltage Vth, asserts or deasserts a fault flag FAULT at its output, and is powered between a supply voltage VCCA and ground. A p-channel transistor M6 has its source coupled to the output node NOUT, its drain coupled to ground through resistor R12, and its gate coupled to its drain. A Zener diode Dz5 has its anode coupled to ground and its cathode coupled to the output node NOUT.

Operation will be described, but first note that the p-channel transistor M2 is diode coupled because its gate is coupled to its drain through the p-channel transistor M1, which acts as a cascode device. In addition, due to the gate coupling between p-channel transistors M2 and M3, the p-channel transistors M2 and M3 are in a current mirroring relationship.

It is to be noticed that the resistors R11 and R12 are equal in resistance, and that the p-channel transistors M2 and M6 are matched. Under these conditions, assuming that the current mirror formed by p-channel transistors M2 and M3 has a 1:1 mirroring ratio, as will be explained below in detail, it is possible to shift the voltage drop Vld to be present at the input of the comparator 102. This arises from the fact that, through the p-channel transistor M6 (which is matched to M2), the gate to source voltage of p-channel transistor M2 is canceled. Stated another way, the voltage drop Vld is applied to the series circuit of p-channel transistor M2 (in diode configuration) and resistor R11. The current that flows through this branch is dependent on the gate to source voltage of p-channel transistor M2. As will be seen mathematically below, the gate to source voltage of the p-channel transistor M2 is canceled out by the matched gate to source voltage of the p-channel transistor M6, and therefore the voltage at NOUT reflects the voltage drop Vld.

The Zener diodes Dz1-Dz5 are clamp diodes used to protect the transistors in the safety circuit 100. For example, the p-channel transistors M2, M3, M5, and M6 can be considered "standard" devices, are rated to withstand 5.5 V, and therefore their gate to source voltage and their drain to source voltage are to be lower than 5.5 V. The p-channel transistors M1 and M4 are considered "high voltage" devices and are to be maintained with their gate to source voltage less than 5.5 V and their drain to source voltage less than a given value that is related to the voltage class of the device (e.g., 60 V for the p-channel transistors M1 and M4). As an example of operation, if the voltage at the gates of p-channel transistors M2 and M3 were to fall more than 5.5 V with respect to VHV due to a transient, the gate to source voltage could exceed a safe level. However, the Zener diode Dz2 is activated so that it will avalanche prior to the gate to source voltage of the p-channel transistors M2 and M3 exceeding a safe level, therefore clamping their gates to a safe level.

The current generator 103, diode coupled p-channel transistor M5, and the capacitor C11 form a bias setting circuit for the cascode p-channel transistors M1 and M4. In greater detail, consider the path parallel to that of the laser diode 104 coupled between the high voltage node VHV and node ND. This parallel path includes the Zener diode Dz4, p-channel transistor M5, and resistor R11. The capacitor C11 acts as a filter and stabilizes the gate to source voltage of the p-channel transistor M5 against high frequency perturbations. The current Ibias generated by the current source 103 is sunk by the series path of the p-channel transistor M5, resistor R11, and laser diode 104. Therefore, the voltage at the gate and source of the p-channel transistor M5 is fixed to VHV−Ibias*R11−Vld, with Vld being the forward voltage across the laser diode 104 when biased by Ibias. Therefore, by adjusting the magnitude of the bias current Ibias, a bias voltage Vbias suitable for biasing the cascode p-channel transistors M1 and M4 is generated.

Assuming that the voltage drop Vld appears at the node ND, that same voltage drop is applied to the series branch formed from the diode coupled p-channel transistor M2 (cascoded by p-channel transistor M1) and resistor R11. Consequently, the current flowing across this branch is calculated as: $I_{M2}=(Vld-V_{GS,M2})/R11$.

$I_{M2}$ is mirrored to the p-channel transistor M3 as current $I_{M3}$, and therefore drives the diode coupled p-channel transistor M6 and the resistor R12. This produces a voltage Vrep at the output node NOUT that is equal to the voltage drop Vld across the laser diode 104. Mathematically, this is shown as:

$$Vrep=(V_{GS,M6}+R12*I_{M3})=V_{GS,M6}+Vld-V_{GS,M2}=Vld$$

The comparator 102 receives Vrep and Vth, and if Vrep exceeds Vth, then Vld has reached an unsafe level, and the fault flag FLAG is asserted.

A fault detection circuit 150 receives the fault flag FLAG. The fault detection circuit 150 includes a delay circuit 151 receiving the fault flag FLAG and outputting a delayed version of the fault flag as FAULTD. An AND gate 152 receives the delayed fault flag FAULTD and the fault flag FLAG, performs a logical AND operation, and drives the clock input of the flip flop 153 with the result.

The flip flop 153 has a clock input receiving the output of the AND gate 152, a D input coupled to the supply voltage VCCA, a clear input coupled to a fault clear signal FAULT_CLR, and a Q output at which a fault output signal FAULT_OUT is generated.

At the instant where the fault flag FLAG goes high to indicate that the voltage drop Vld across the laser diode 104 has exceeded the threshold voltage Vth, the AND gate 152 will receive a logic high from the fault flag FLAG and a logic low from the delay circuit 151 (because the fault flag FLAG has not yet had time to propagate through the delay circuit 151). Therefore, the output of the AND gate 152 will remain low until the end of the delay imposed by the delay circuit 151, at which time FAULTD will go high, and the output of the AND gate 152 will then go high, clocking the rising edge triggered clock input of the flip flop 153, and causing FAULT_OUT to go high. Consequently, the output of the AND gate 152 (and thus FAULT_OUT) will only go high if the fault remains for a period of time greater than the delay of the delay circuit 151. The fault output signal FAULT_OUT can be used by other components to shut down the laser driver to quench the laser drive current, after which point the fault clear signal FAULT_CLR will go high to reset the output FAULT_OUT of the flip flop 153 to low.

Note that the other components referred to above may take action based on the fault output signal FAULT_OUT, the fault signal FAULT itself, or a combination of the two. For example, the laser driver can be shut down upon the fault signal FAULT going high, or instead upon the FAULT_OUT signal going high.

It is pointed out that the voltage drop Vld across the laser diode 104 will increase as a result of proper laser drive current pulse generation. Therefore, the usage of the FAULT_OUT signal is particularly useful because the delay of the delay block 151 can be set to be greater than or equal to the expected period of voltage drop due to proper laser drive current pulse generation, therefore in essence filtering out the expected voltage drops.

It is also pointed out that the threshold voltage Vth can be programmable, and also that the delay produced by the delay circuit 151 can be programmable based upon a delay select signal NSEL. This allows for fine tuning of both the voltage drop and the period of voltage drop duration that are considered to indicate a fault.

Figure 8:
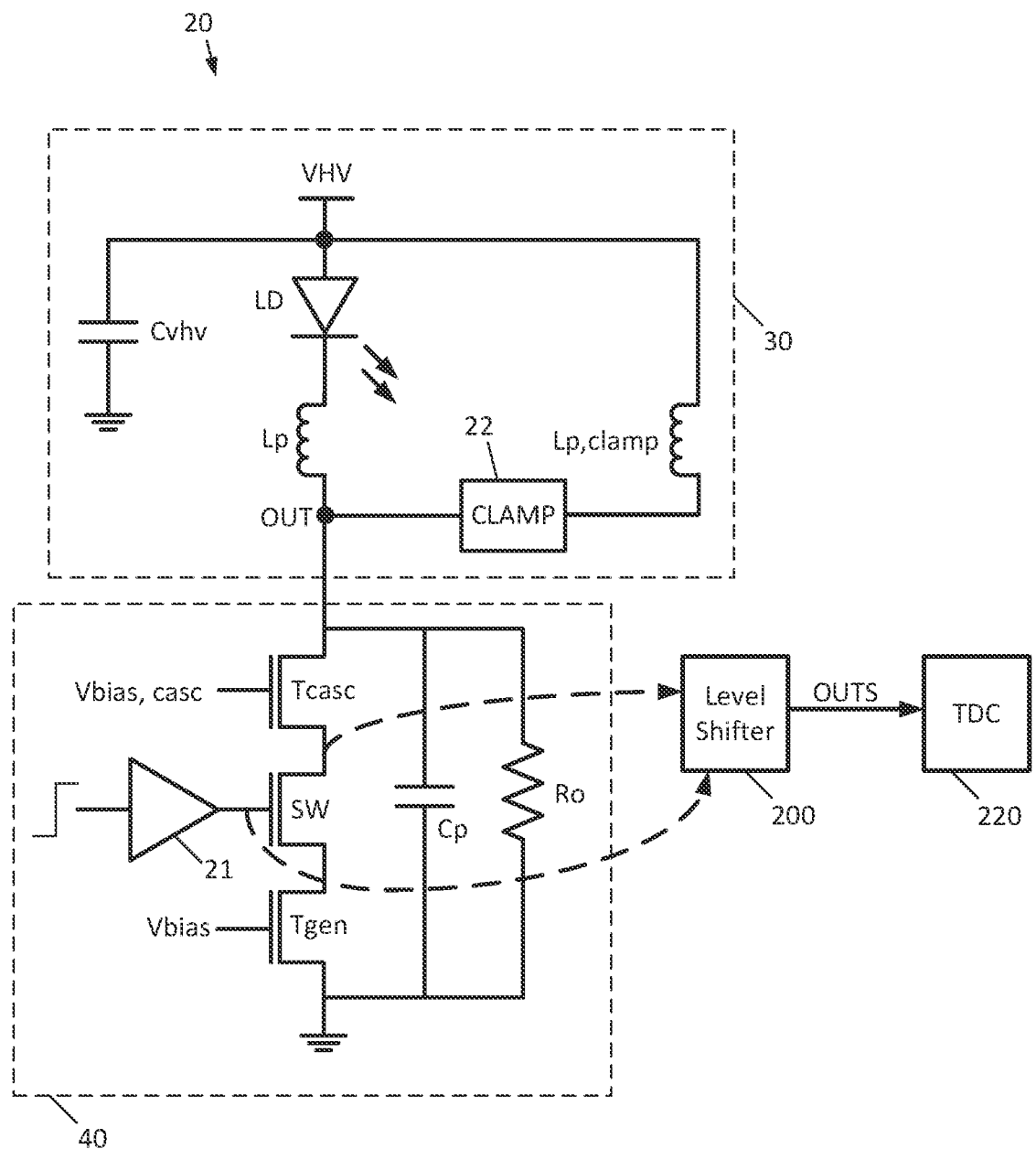
FIG. 8 is a block diagram showing capacitive coupling between the laser driving circuit of FIG. 2 and a level shifter disclosed herein.

As previously explained, a time of flight ranging application, such as LIDAR, utilizes a laser diode driven by a laser driver that generates a pulse drive current to cause the laser diode to emit a short laser pulse in a given direction. As also explained, the laser pulse is reflected by a possible object in the given direction, a receiver receives and reads the reflected pulse, and by determining the elapsed time from emission of the laser pulse to receipt of the reflected pulse, the distance to the given object can be determined. The determination of the elapsed time from emission of the laser pulse to receipt of the reflected pulse therefore involves the determination of the instant in time at which the laser pulse was emitted. Traditionally, this is done utilizing a reference receiver facing the laser diode through a suitable optical path which detects the emission of the laser pulse by the laser diode. However, in some situations it may not be desirable to use a reference detector and additional optical path to detect the emission of the laser pulse by the laser diode. Therefore, the level shifter system 200 of FIG. 8-9 has been developed for these purposes.

A capacitive coupling between the level shifter system 200 and a laser driver (here, shown as the laser driver 20 described above) is shown in FIG. 8 through which a synchronization signal indicative of the start time of the laser drive pulse is extracted from the laser driver 20 by the level shifter 200. This synchronization signal is used as a reference time signal by a time-to-digital-converter (TDC) 220.

Typically, a TDC 20 is required to be particularly accurate for time of flight ranging operations, having a resolution on the order of tens of picoseconds. However, in order to achieve this, TDCs 20 are designed in advanced technologies where the supply voltages utilized are on the order of 1 V or less. Therefore, these TDC designs 20 are not directly compatible with signals from the laser driver 20, which utilizes a supply voltage on the order of 5 V (even neglecting the voltage at the output node OUT of the laser driver 20 that is referred to a high voltage supply VHV).

It is known to use level shifters to move and buffer a digital signal from a higher voltage domain to a lower voltage domain (for example, from 5 V to 1 V). However, such known level shifters introduce a non-negligible delay between receiving the input signal to be shifted and outputting the shifted output signal. This delay can be calibrated and accounted for, however it is inherently sensitive to process, voltage, and temperature variations, which is not acceptable for a time of flight ranging system where precise timing is to be used, as this would result in an inconsistent reference starting point used by the TDC 220 to measure the time of flight of the laser pulse.

The level shifter 200 will be described in detail below, but first the capacitive coupling itself between the laser driver 20 and level shifter system 200 is described. The level shifter 200 reads an AC voltage drop appearing at an appropriate node of the cascode current generator 40 of the laser driver 20. This AC voltage drop is read by the level shifter system 200 and digitized. The capacitive coupling itself can be between the input to the level shifter 200 and the output of the driver amplifier 21, and this output of the driver amplifier 21 can be moving from 0 V to VCCA (e.g., 5 V). The capacitive coupling can instead be between the input to the level shifter 200 and the drain of the switch transistor SW—this has the advantage of the coupled AC voltage drop being closer in time to generation of the laser drive pulse, as opposed to the rising of the trigger pulse, which occurs prior to the generation of the laser drive pulse by the turn-on time of the transistor switch SW and the cascode current generator 40; however, this also has the disadvantage of the fact that the voltage swing on the drain of the transistor switch SW is less than 1 V, as opposed to the voltage swing of 5 V that occurs on the gate of the transistor switch SW, so the signal to read is weaker. Note that where the AC voltage drop at the output of the driver amplifier 21 is read, it is the rising edge that is read, but where the AC voltage at the drain of the switch SW is read, it is the falling edge that is read.

The level shifter 200 is now described in detail with reference to FIG. 9. The level shifter 200 shows the aforementioned capacitive coupling as capacitor C111 coupled between the laser driver 20 and the level shifter input node LSIN. A capacitor C222 is coupled between the level shifter input node LSIN and ground. A CMOS inverter 210 is formed by the p-channel transistor M12 and the n-channel transistor M11. In particular, the p-channel transistor M12 has its source coupled to the supply node VDDIO (which belongs to the lower voltage domain that the synchronization signal is being shifted to), its drain coupled to the level shifter output node LSOUT, and its gate coupled to the level shifter input node LSIN. The n-channel transistor M11 has its drain coupled to the level shifter output node LSOUT, its source coupled to ground, and its gate coupled to the level shifter input node LSIN.

The p-channel transistor M13 is selectively coupled in parallel with the p-channel transistor M12, with its source coupled to the supply node VDDIO, its drain selectively coupled to the level shifter output node LSOUT by switch S2, and its gate coupled to the gate of the p-channel transistor M12. A switch S1 selectively couples the level shifter input node LSIN to the level shifter output node LSOUT. The switch S2 is operated based upon assertion of a control signal CTRL, while the switch S1 is operated based upon assertion of the complement CTRLB of the control signal.

A buffer 201 has an input coupled to the level shifter output node LSOUT and an output coupled to the input of a buffer 202. The buffer 202 has an output providing a level shifted output signal OUTS.

Operation of the level shifter 200 is now described. The control signal CTRL is correlated to the trigger signal from the driver amplifier 21, meaning that when the trigger signal is low, the control signal CTRL is low (so, switch S2 is open while switch S1 is closed), and when the trigger signal is high, the control signal CTRL is high (so, switch S2 is closed while switch S1 is open).

In a steady state prior to the trigger signal from the driver amplifier 21 going high, the control signal CTRL is low, and therefore the switch S1 is closed while the switch S2 is open. This couples the input and output of the inverter 210 together, setting the input and the output of the inverter 210 to a threshold voltage, which is the threshold voltage above or below which an input to the inverter will cause switching of the output of the inverter.

This threshold voltage is stored by the capacitors C111 and C222. In greater detail, capacitor C111 is the effective decoupling capacitor, while C222 is used to provide for capacitive partitioning so that the voltage drop that will appear at the node LSIN as a consequence of the voltage drop in the laser driver is properly attenuated to withstand the SOA of the level shifter. For example, assuming that the output of the driver 21 is switching from 0 V to 5V, if the input capacitance of the inverter 210 is negligible, the same 5 V drop will appear at the node LSIN, which is an issue if the inverter is unable to sustain this voltage. The capacitor C222 leads to an attenuation equal to $$\frac{C111}{C111 + C222}$$

of the voltage drop that allows satisfaction of the SOA constraints.

This threshold voltage is a fraction of the supply voltage VDDIO (with the fraction being related to the on resistance of the p-channel transistor M12 and the n-channel transistor M11), and when the inverter 210 is in this condition, it works as an analog amplifier as far as small signals at its input are concerned, and has a high voltage gain and wide bandwidth.

This is particularly suited for reading a signal that is not a pure digital signal, such as the voltage drop from the laser driver 20 capacitively transferred to the level shifter input node LSIN.

After the switch S1 is switched off, the inverter 210 remains in its threshold condition if its input remains unchanged, but due to its high gain and large bandwidth, a slight variation at its input will lead to a switching of its output. When the inverter 210 is in its threshold condition with its input and output equal, the buffer 201 is designed to read this voltage at the level shifter output LSOUT as a logic high (although in some cases the buffer 201 could be switched off to save power and set its output in this condition to a logic high).

When the trigger signal goes high, a delay will be present before the trigger signal is fully transferred to the level shifter input LSIN. During this delay, the inverter 210 is in its threshold condition, and due to the sensitivity in that condition, there could be multiple improper switchings of the inverter 210, which could read by the TDC 200, resulting in improper operation of the time of flight ranging system.

To address this, when switch S1 opens, the switch S2 closes, coupling the p-channel transistor M13 is parallel with the p-channel transistor M12, and therefore altering the threshold voltage of the inverter 210 to be higher than the threshold voltage was without the p-channel transistor M13 coupled in parallel. This reduces the sensitivity of the inverter 210 to input noise and resulting unwanted bouncing due to noise, and sets the output of the inverter 210 at the level shifter output LSOUT to a logic high. Once the voltage at the level shifter input LSIN is above this greater threshold voltage due to the trigger signal sufficiently rising and propagating to the level shifter input LSIN, the inverter 210 switches its output at the level shifter output LSOUT low because the p-channel transistors M12 and M13 will turn off while transistor the M11 turns on, and this logic low will be buffered by the buffers 201 and 202 as the level shifted output signal OUTS.

Similarly, when the trigger signal goes low, a delay will be present before the voltage at the level shifter input LSIN begins to fall. However, since the switch S1 will be closed and switch S2 will be opened, the increased threshold voltage of the inverter 210 will be removed by decoupling the p-channel transistor M13 from the p-channel transistor M12. This means that the voltage at the level shifter input LSIN will have to fall below the original threshold voltage (as opposed to the increased threshold voltage) for the inverter 210 to re-assert its output at the level shifter LSOUT as a logic high due (which here is VDDIO, which is the lower voltage domain supply) to turn the p-channel transistor M12 on and the n-channel transistor M11 off, which will be buffered by the buffers 201 and 202 as the level shifted output signal OUTS.

Note that the role of the p-channel transistor M13 is mainly of interest to the switching off of the switch S1, as the level shifter 200 is not of great importance on the other edge—in fact, the chief role of the level shifter 200 is to provide a clear trigger OUTS used to start the TDC 220, and it is this triggering edge that is read by the TDC, with the following edge not being influential as the TDC 220 is stopped by the receiver when a reflected laser light pulse is received.

Due to the above-described switching of the switches S1 and S2, the inverter 210 is protected from unwanted output bouncing due to input noise, while switching its output properly and quickly as desired.

Note that the buffer 201 is biased by a current proportional to absolute temperature IPTAT from a current generator 203. The biasing of the buffer 201 with IPTAT provides for a shorter transmission delay at higher temperature and a longer transmission delay at lower temperature. Since other delays within the level shifter 200 increase with temperature, the biasing of the buffer 201 with IPTAT therefore performs a rough compensation of the global delay of the level shifter 200 against temperature variation, which is particularly useful given that the output of the inverter 210 is not purely digital in nature and has a slower slope than a purely digital signal. After the buffer 201, the transmitted signal switches in a purely digital fashion, and therefore the buffer 202 is not shown as being biased with IPTAT.

As shown in FIG. 7, the level shifted output signal OUTS output by the level shifter 200 is received by the TDC 220. The TDC 220 interprets this level shifted output signal OUTS as a start signal. Therefore, as soon as OUTS switches (meaning that the laser drive pulse is generated at this moment, in turn meaning that the laser diode LD has emitted a laser pulse, neglecting a slight stable delay that can be compensated for), the TDC 220 starts to count and the counting will proceed until an end point at which a reflected laser pulse is received. From this elapsed time, the distance to the object from which the laser pulse is reflected can be determined.

Figure 9:
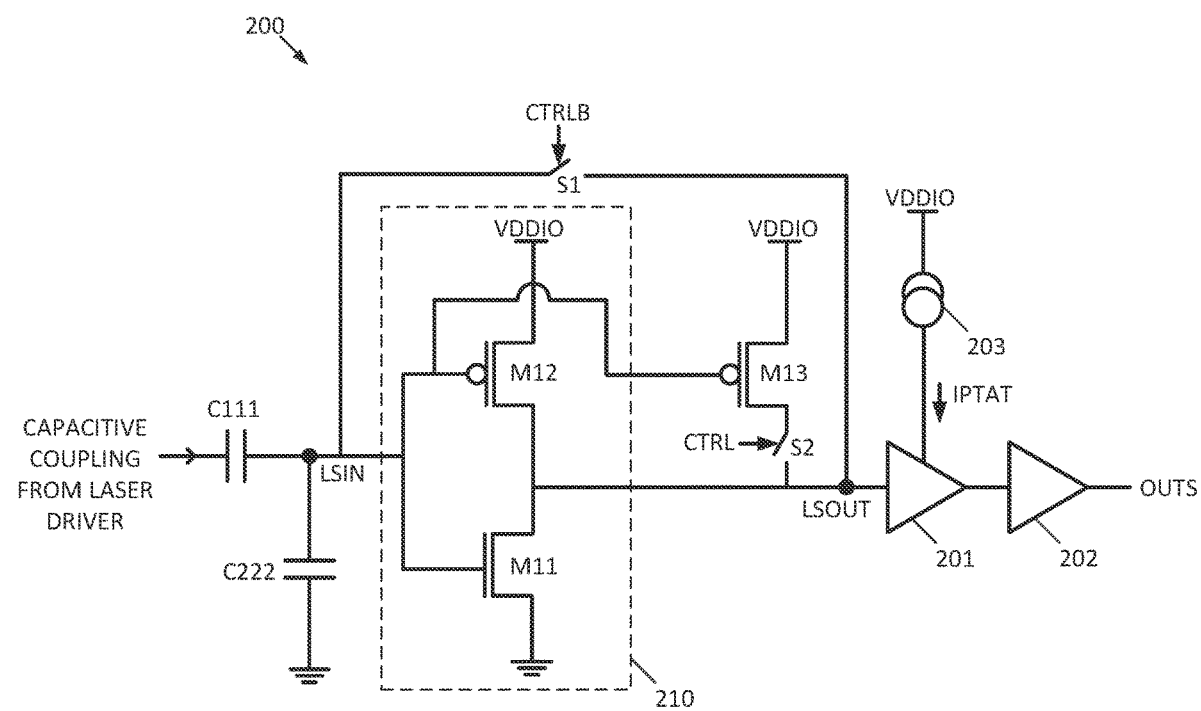
FIG. 9 is a schematic diagram of the level shifter of FIG. 8.
Figure 10:
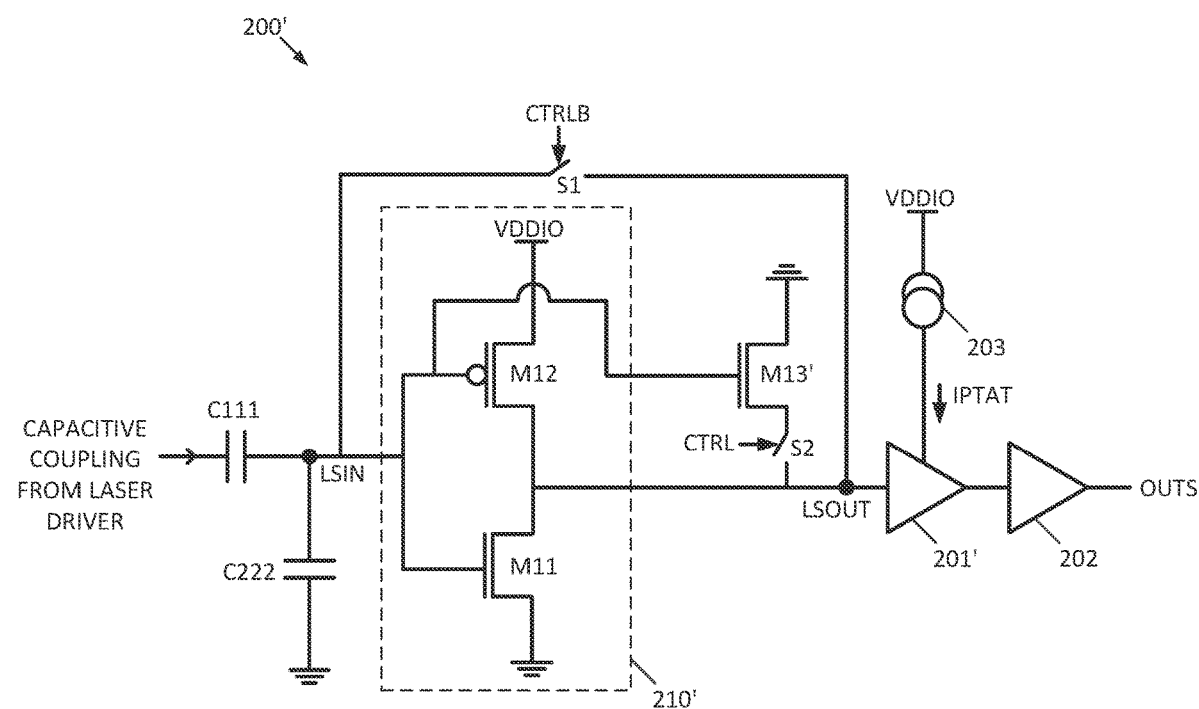
FIG. 10 is a schematic diagram of an alternate configuration of the level shifter of FIG. 8.

It is highlighted at the level shifter 200 of FIG. 9 is of use in the case where the capacitive coupling C111 is referred to the output of the driver amplifier 21. However, now consider the case in which the capacitive coupling C111 is instead referred to the drain of the transistor switch SW. In that case, a negative voltage drop is to be read. The level shifter 200 of FIG. 9 is easily modified to handle this scenario. Therefore, with reference to FIG. 10, the drain of the n-channel transistor M13' of the level shifter 200' is selectively coupled through the switch S2 to the node LSOUT, with the gate of M13' being coupled to LSIN and the source of M13' being coupled to ground. In this configuration, the buffer 201' will be so designed that, when the inverter 210' is in the threshold condition with the switch S1 closed, LSOUT is read as a logic low. When a current pulse is generated by the laser driver, the switch S1 is switched off and the switch S2 is switched on. In this case, the threshold of the inverter 210' is therefore lowered due to the presence of the n-channel transistor M13, confirming the status of the output of the buffer 201' (since it will read a stronger logic low at its input and avoid false switching while waiting for the negative voltage drop at LSIN that will raise the voltage at LSOUT). The core concept is to shift the value of the output of the inverter 210' to enforce a reset condition while waiting for the real signal to be read. By reset condition, the value is that is digitally defined at the output OUTS when the switch S2 is closed is meant. It bears repeating that in this condition with the switch S1 closed, the inverter 210' is operating in an analog mode and providing at its output the threshold voltage. The buffer 201' is designed in order to transfer forward clear digital information, such as by being designed to read the threshold voltage at LSOUT as a logic high or a logic low. As an alternative, the design can be to switch off and properly reset the buffer 201' itself.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A circuit, comprising:
an input node configured to be coupled to a cathode of a laser diode having its anode coupled to a high voltage supply node;
a cascoded current mirror having an input branch and an output branch, wherein the input branch is coupled between the high voltage supply node and a sense resistor coupled to the input node, and wherein the output branch is coupled between the high voltage supply node and an output node;
a sense circuit coupled between the output node and ground, wherein the sense circuit comprises a diode coupled transistor coupled to the output node and a resistor coupled between the diode coupled transistor and a ground node;
wherein the input branch is configured to generate a current proportional to a voltage drop across the laser diode;
wherein the output branch is configured to generate a mirrored current proportional to the current proportional to the voltage drop across the laser diode;
wherein a voltage proportional to the voltage drop across the laser diode is generated as a result of the mirrored current flowing through the sense resistor; and
a comparison circuit configured to compare the voltage proportional to the voltage drop across the laser diode to a threshold voltage.

2. The circuit of claim 1, wherein the comparison circuit is configured to assert a fault output if the voltage proportional to the voltage drop across the laser diode exceeds the threshold voltage for a set period of time.

3. The circuit of claim 2, wherein the set period of time is at least equal to an expected duration of a laser drive current pulse.

4. The circuit of claim 1, wherein the comparison circuit is configured to assert a fault flag if the voltage proportional to the voltage drop across the laser diode exceeds the threshold voltage.

5. The circuit of claim 1, further comprising a bias setting current configured to bias cascode transistors of the cascoded current mirror.

6. The circuit of claim 1, further comprising clamp circuits configured to protect transistors of the cascoded current mirror against damage.

7. A circuit, comprising:
a cascoded current mirror having an input branch and an output branch;
a first sense resistor coupled between the input branch and an input node, wherein the input node is configured to be coupled to a cathode of a laser diode having its anode coupled to a high voltage supply node;
an output node coupled to the output branch;
a sense branch coupled between the output node and a ground node; and
a comparator having a first input coupled to the output node, a second input coupled to a threshold voltage, and an output configured to generate a fault flag.

8. The circuit of claim 7, wherein the cascoded current mirror comprises:
a first transistor having a drain coupled to the first sense resistor, a source, and a gate;
a second transistor having a drain coupled to the source of the first transistor, a source coupled to the high voltage supply node, and a gate coupled to the drain of the first transistor to define a diode configuration;
a third transistor having a source coupled to the high voltage supply node, a drain, and a gate coupled to the gate of the second transistor; and
a fourth transistor having a source coupled to the drain of the third transistor, a drain coupled to the output node, and a gate coupled to the gate of the first transistor.

9. The circuit of claim 8, further comprising:
a first Zener diode having an anode coupled to the source of the first transistor and the drain of the second transistor, and a cathode coupled to the high voltage supply node;
a second Zener diode having an anode coupled to the gates of the second and third transistors, and a cathode coupled to the high voltage supply node;
a third Zener diode having an anode coupled to the source of the fourth transistor and the drain of the third transistor, and a cathode coupled to the high voltage supply node; and
a fourth Zener diode having an anode coupled to the gates of the first and fourth transistors, and a cathode coupled to the high voltage supply node.

10. The circuit of claim 8, further comprising a bias setting circuit, the bias setting circuit comprising:
a fifth transistor having a drain coupled to the gates of the first and fourth transistors, a source coupled to the drain of the first transistor, and a gate directly coupled to the drain of the fifth transistor and indirectly coupled to the source of the fifth transistor through a capacitor; and
a current source generating a bias current received by the drain of the fifth transistor.

11. The circuit of claim 7, wherein the sense branch comprises:
a diode coupled transistor having a source coupled to the output node, a drain, and a gate coupled to the drain of the diode coupled transistor; and
a second sense resistor coupled between the drain of the diode coupled transistor and ground.

12. The circuit of claim 11, further comprising a fifth Zener diode having an anode coupled to a ground node, and a cathode coupled to the output node.

13. The circuit of claim 7, further comprising a digital circuit, wherein the digital circuit comprises:
a delay circuit configured to receive the fault flag and to output a delayed version of the fault flag;
an AND gate having a first input configured to receive the fault flag, a second input configured to receive the delayed version of the fault flag, and an output configured to generate a clock pulse; and
a flip flop having a data input coupled to a supply voltage, a clock input coupled to the output of the AND gate, a clear input coupled to a fault clear signal, and an output generating a fault output signal.

14. A method of detecting faults in driving of a laser diode, the method comprising:
when a voltage proportional to a voltage drop across the laser diode rises and remains above a threshold voltage for a period of time greater than an expected duration of a laser drive current pulse, indicating detection of a fault in the driving of the laser diode.

15. The method of claim 14, further comprising, prior to indicating, comparing the voltage proportional to the voltage drop across the laser diode to the threshold voltage.

16. The method of claim 14, further comprising generating the voltage proportional to the voltage drop across the laser diode.

17. The method of claim 16, wherein generating the voltage proportional to the voltage drop across the laser diode comprises:
- generating a current proportional to the voltage drop across the laser diode;
- mirroring the current proportional to the voltage drop across the laser diode, across a cascoded current mirror, to produce a mirrored current; and
- generating the voltage proportional to the voltage drop across the laser diode as being equal to a voltage drop of the mirrored current across a voltage replication circuit.

18. The method of claim 14, further comprising receiving external input setting the threshold voltage and setting the period of time.

* * * * *